US011653492B2

(12) United States Patent
Chang et al.

(10) Patent No.: US 11,653,492 B2
(45) Date of Patent: May 16, 2023

(54) MEMORY DEVICES AND METHODS OF MANUFACTURING THEREOF

(71) Applicant: Taiwan Semiconductor Manufacturing Company Limited, Hsinchu (TW)

(72) Inventors: Meng-Sheng Chang, Chu-bei (TW); Chia-En Huang, Xinfeng Township (TW); Yih Wang, Hsinchu (TW)

(73) Assignee: TAIWAN SEMICONDUCTOR MANUFACTURING LIMITED, Hsinchu (TW)

( * ) Notice: Subject to any disclaimer, the term of this patent is extended or adjusted under 35 U.S.C. 154(b) by 0 days.

(21) Appl. No.: 16/786,521

(22) Filed: Feb. 10, 2020

(65) Prior Publication Data
US 2021/0249423 A1    Aug. 12, 2021

(51) Int. Cl.
| | |
|---|---|
| *H01L 27/112* | (2006.01) |
| *H01L 27/088* | (2006.01) |
| *H01L 29/78* | (2006.01) |
| *H01L 29/04* | (2006.01) |

(Continued)

(52) U.S. Cl.
CPC .... *H01L 27/11206* (2013.01); *H01L 27/0886* (2013.01); *H01L 29/045* (2013.01); *H01L 29/0673* (2013.01); *H01L 29/66795* (2013.01); *H01L 29/785* (2013.01)

(58) Field of Classification Search
CPC ............. H01L 27/0866; H01L 27/0924; H01L 27/0922; H01L 27/11206
See application file for complete search history.

(56) References Cited

U.S. PATENT DOCUMENTS

| | | | |
|---|---|---|---|
| 10,332,881 B1* | 6/2019 | Badaroglu | .......... H01L 27/0207 |
| 10,950,609 B2* | 3/2021 | Yang | .................. H01L 27/0922 |
| 2017/0141113 A1* | 5/2017 | Sagong | ........... H01L 21/823807 |

(Continued)

FOREIGN PATENT DOCUMENTS

| | | |
|---|---|---|
| DE | 11 2016 004 265 T5 | 7/2018 |
| KR | 1020170045616 A | 4/2017 |

(Continued)

OTHER PUBLICATIONS

Korean Notice of Allowance on KR Appl. Ser. No. 10-2020-0058563 dated Oct. 30, 2021 (3 pages).

*Primary Examiner* — Jesse Y Miyoshi
(74) *Attorney, Agent, or Firm* — Foley & Lardner LLP

(57) ABSTRACT

A semiconductor device is disclosed. The semiconductor device includes a fin-based structure formed on a substrate. The semiconductor device includes a plurality of first nanosheets, vertically spaced apart from one another, that are formed on the substrate. The semiconductor device includes a first source/drain (S/D) region electrically coupled to a first end of the fin-based structure. The semiconductor device includes a second S/D region electrically coupled to both of a second end of the fin-based structure and a first end of the plurality of first nanosheets. The semiconductor device includes a third S/D region electrically coupled to a second end of the plurality of first nanosheets. The fin-based structure has a first crystal lattice direction and the plurality of first nano sheets have a second crystal lattice direction, which is different from the first crystal lattice direction.

20 Claims, 24 Drawing Sheets

(51) Int. Cl.
*H01L 29/66* (2006.01)
*H01L 29/06* (2006.01)

(56) References Cited

U.S. PATENT DOCUMENTS

2019/0252555 A1   8/2019  Liang et al.
2019/0326395 A1  10/2019  Ando et al.

FOREIGN PATENT DOCUMENTS

| | | |
|---|---|---|
| KR | 1020190049338 A | 5/2019 |
| KR | 101993958 B1 | 6/2019 |
| TW | 201115626 | 5/2011 |

\* cited by examiner

MEMORY DEVICES AND METHODS OF MANUFACTURING THEREOF

BACKGROUND

This disclosure relates generally to a semiconductor device, and in some embodiments, to a memory device including different crystal lattice directions.

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor. A gate dielectric of the programming MOS transistor may be broken down to cause the gate and the source or drain region of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
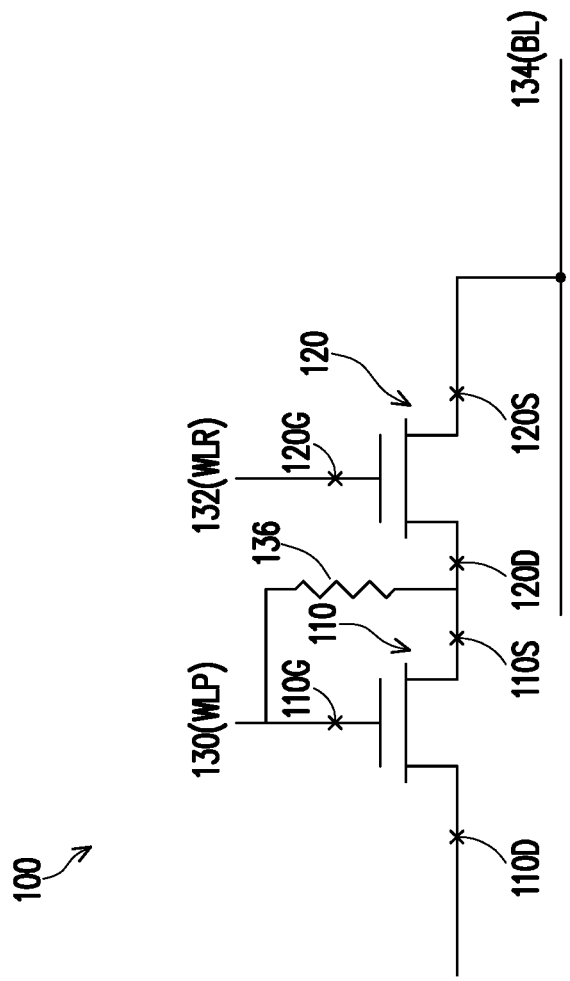
FIG. 1 illustrates an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors, can provide increased device density and increased performance over planar transistors. Some advanced non-planar transistor device architectures, such as nanosheet (or nanowire) transistors, can further increase the performance over fin-based transistors. When compared to the fin-based transistors where the channel is partially wrapped by a gate stack, the nanosheet transistor, in general, includes a gate stack that wraps around the full perimeter of one or more nanosheet channels for improved control of channel current flow, e.g., relatively large driving current for the similar size of a fin-based transistor and a nanosheet transistor.

Figure 24:
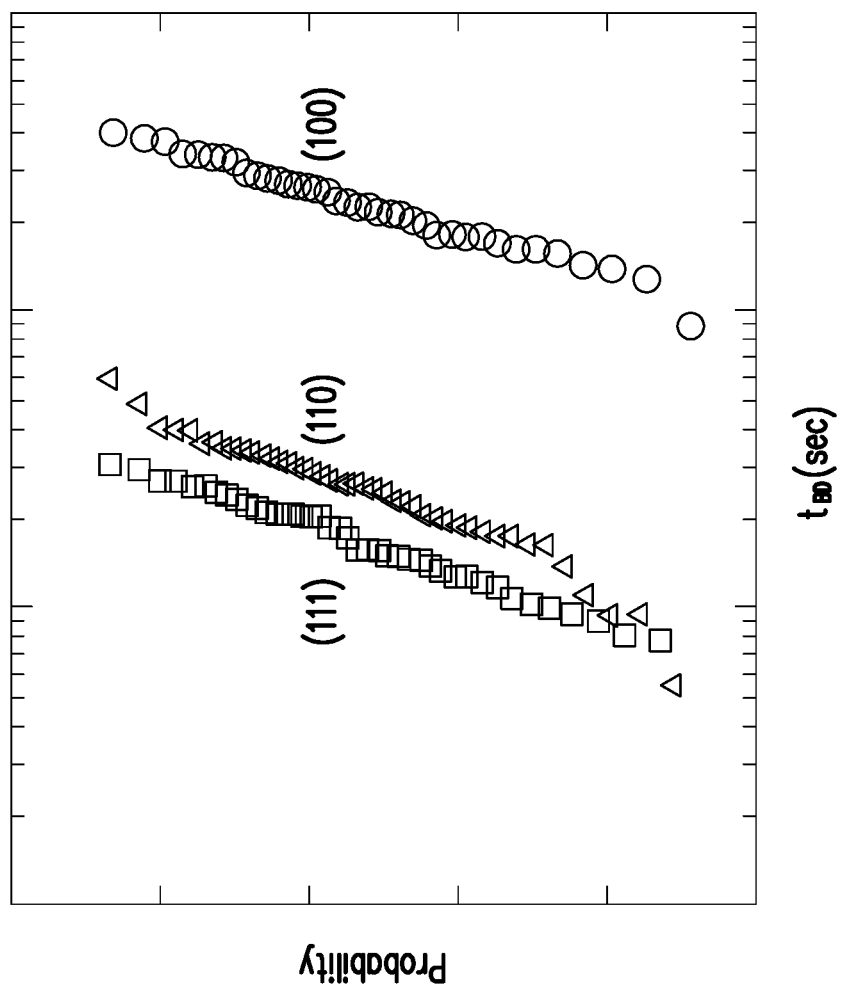
FIG. 24 illustrates a plot comparing the breakdown times among different crystal lattice directions, in accordance with some embodiments.

Given the nanosheet transistors outperforming the fin-based transistors, some of existing memory devices have configured the corresponding memory cells in the nanosheet transistor configuration. For example, an anti-fuse memory cell may include a programming transistor and a reading transistor, each of which is configured as a nanosheet transistor. However, respective active planes (e.g., one or more planes of the conduction channels) of the programming transistor and reading transistor of the existing anti-fuse memory cell typically share identical or substantially similar crystal lattice directions (crystallographic directions, crystal directions, or crystalline directions), for example, a <110> crystal lattice direction. When the active plane of the programming transistor has the <110> crystal lattice direction, the programming transistor may provide decent programming performance (e.g., a low breakdown voltage ($V_{BD}$), a fast breakdown time ($t_{BD}$), etc.). Nevertheless, when the active plane of the reading transistor has the <110> crystal lattice direction, performance of the reading transistor may be compromised. For example in the Weibull plot of FIG. 24 (where the X axis represents the $t_{BD}$ and the Y axis represents the probability), with the active plane extending along the <110> crystal lattice direction, the gate dielectric of the reading transistor may have a relatively shorter $t_{BD}$ when compared to having the active plane extending along the <100> crystal lattice direction, which is typically undesirable as the reading transistor is designed not to be broken down. Thus, the existing anti-fuse memory devices are not entirely satisfactory.

The present disclosure provides various embodiments of a memory cell. In some embodiments, the disclosed memory cell includes an anti-fuse memory cell that includes a programming transistor and one or more reading transistors. The programming transistor is configured as a fin-based transistor, and the one or more reading transistors are each configured as a nanosheet transistor. The fin-based transistor and the one or more reading transistors are electrically coupled to one another via one or more shared source/drain regions. Further, an active plane of the programming transistor and an active plane of the one or more reading transistor are different from each other. For example, an active plane of the fin-based programming transistor may be configured to have a <110> crystal lattice direction, and an active plane of the nanosheet reading transistor(s) may be configured to have a <100> crystal lattice direction. In general, a nanosheet transistor can present a significantly extended $t_{BD}$ when the active plane has the <110> crystal lattice direction. As such, while keeping the decent programming performance of the programming transistor, reliability of the reading transistor can also be improved.

FIG. 1 illustrates an example circuit diagram of a memory cell 100, in accordance with some embodiments. As shown, the memory cell (or sometimes referred to as a memory bit cell, a memory bit, or a bit) 100 includes a first transistor 110 and a second transistor 120. Each of the first and second transistors, 110 and 120, may include an n-type metal-oxide-semiconductor field-effect-transistor (MOSFET). The transistors 110 and 120 may each include another type of the MOSFET, e.g., a p-type MOSFET. In some other embodiments, at least one of the transistor 110 or 120 may be replaced by another type of electronic devices, e.g., a MOS capacitor, while remaining within the scope of the present disclosure. The first transistor 110 and the second transistor 120 are electrically coupled to each other in series. For example, source of the first transistor, 110S, is connected to drain of the second transistor, 120D.

The memory cell 100 may be configured as an one-time-programmable (OTP) memory cell such as, for example, an anti-fuse cell. It is understood that the memory cell 100 may be configured as any type of the memory cell that includes two transistors electrically coupled to each other in series (e.g., a NOR-type non-volatile memory cell, a dynamic random-access memory (DRAM) cell, a two-transistor static random-access memory (SRMA) cell, etc.).

When the memory cell 100 is configured as an anti-fuse cell, the first transistor 110 can function as a programming transistor and the second transistor 120 can function as a reading transistor. As such, drain of the first transistor 110D is floating (e.g., coupled to nothing), and gate of the first transistor 110G is coupled to a programming word line (WLP) 130; and gate of the second transistor 120G is coupled to a reading word line (WLR) 132, and source of the second transistor 120S is coupled to a bit line (BL) 134.

To program the memory cell 100, the reading transistor 120 is turned on by supplying a high voltage (e.g., a positive voltage corresponding to a logic high state) to the gate 120G via the WLR 132. Prior to, concurrently with or subsequently to the reading transistor 120 being turned on, a sufficiently high voltage (e.g., a breakdown voltage ($V_{BD}$)) is applied to the WLP 130, and a low voltage (e.g., a positive voltage corresponding to a logic low state) is applied to the BL 134. The low voltage (applied on the BL 134) can be passed to the source 110S such that $V_{BD}$ will be created across the source 110S and the gate 110G to cause a breakdown of a portion of a gate dielectric (e.g., the portion between the source 110S and the gate 110G) of the programming transistor 110. After the gate dielectric of the programming transistor 110, a behavior of the portion interconnecting the gate 110G and source 110S is equivalently resistive. For example, such a portion may function as a resistor 136. Before the programming (before the gate dielectric of the programming transistor 110 is broken down), no conduction path exists between the BL 134 and the WLP 130, when the reading transistor 120 is turned on; and after the programming, a conduction path exists between the BL 134 and the WLP 130 (e.g., via the resistor 136), when the reading transistor 120 is turned on.

To read the memory cell 100, similarly to the programming, the reading transistor 120 is turned on and the BL 134 is coupled to a voltage corresponding to the logic low state. In response, a positive voltage is applied to the gate of the programming transistor 110G. As discussed above, if the gate dielectric of the programming transistor 110 is not broken down, no conduction path exists between the BL 134 and the WLP 130. Thus, a relatively low current conducts from the WLP 130, through the transistors 110 and 120, and to the BL 134. If the gate dielectric of the programming transistor 110 is broken down, a conduction path exists between the BL 134 and the WLP 130. Thus, a relatively high current conducts from the WLP 130, through the transistor 110 (now equivalent to the resistor 136) and transistor 120, and to the BL 134. Such a low current and high current may sometimes be referred to as $I_{off}$ and $I_{on}$ of the memory cell 110, respectively. A circuit component (e.g., a sensing amplifier), coupled to the BL 134 can differentiate $I_{off}$ from $I_{on}$ (or vice versa), and thus determine whether the memory cell 100 presents a logic high ("1") or a logic low ("0"). For example, when $I_{on}$ is read, the memory cell 100 may present 1; and when $I_{off}$ is read, the memory cell 100 may present 0.

Figure 2:
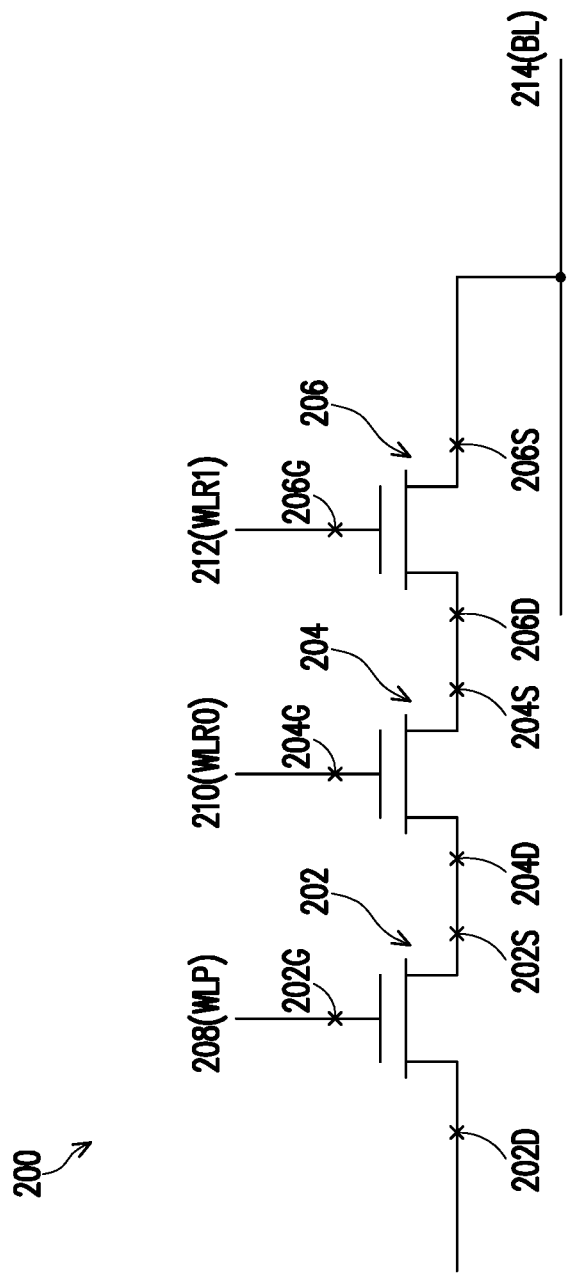
FIG. 2 illustrates an example circuit diagram of another memory cell, in accordance with some embodiments.

FIG. 2 illustrates an example circuit diagram of another memory cell 200, in accordance with some embodiments. The memory cell 200 is similar as the memory cell 100 of FIG. 1, except that the memory cell 200 includes an additional reading transistor. As shown, the memory cell 200 includes a first transistor 202, a second transistor 204, and a third transistor 206. Each of the first, second, and third transistors, 202-206, may include an n-type MOSFET. In some other embodiments, each of the transistors 202-206 may include a p-type MOSFET while remaining within the scope of the present disclosure. The first transistor 202, the second transistor 204, and the third transistor 206 are electrically coupled to each other in series. For example, source of the first transistor, 202S, is connected to drain of the second transistor, 204D, and source of the second transistor, 204S, is connected to drain of the third transistor, 206D. The memory cell 200 may function as an anti-fuse cell (as discussed above), where the first transistor 202 functions as a programming transistor of the anti-fuse cell and the second and third transistors, 204 and 206, collectively function as reading transistors of the anti-fuse cell. Similarly to the memory cell 100, the gate of the programming transistor 202G is coupled to a WLP 208, the gates of the reading transistors, 204G and 206G, are respectively coupled to a WLR0 210 and WLR1 212, and the source of the reading transistor 206S is coupled to a BL 214. Operations of the memory cell 200 is substantially similar to the operations of the memory cell 100, and thus, the discussion shall not be repeated.

Figure 3:
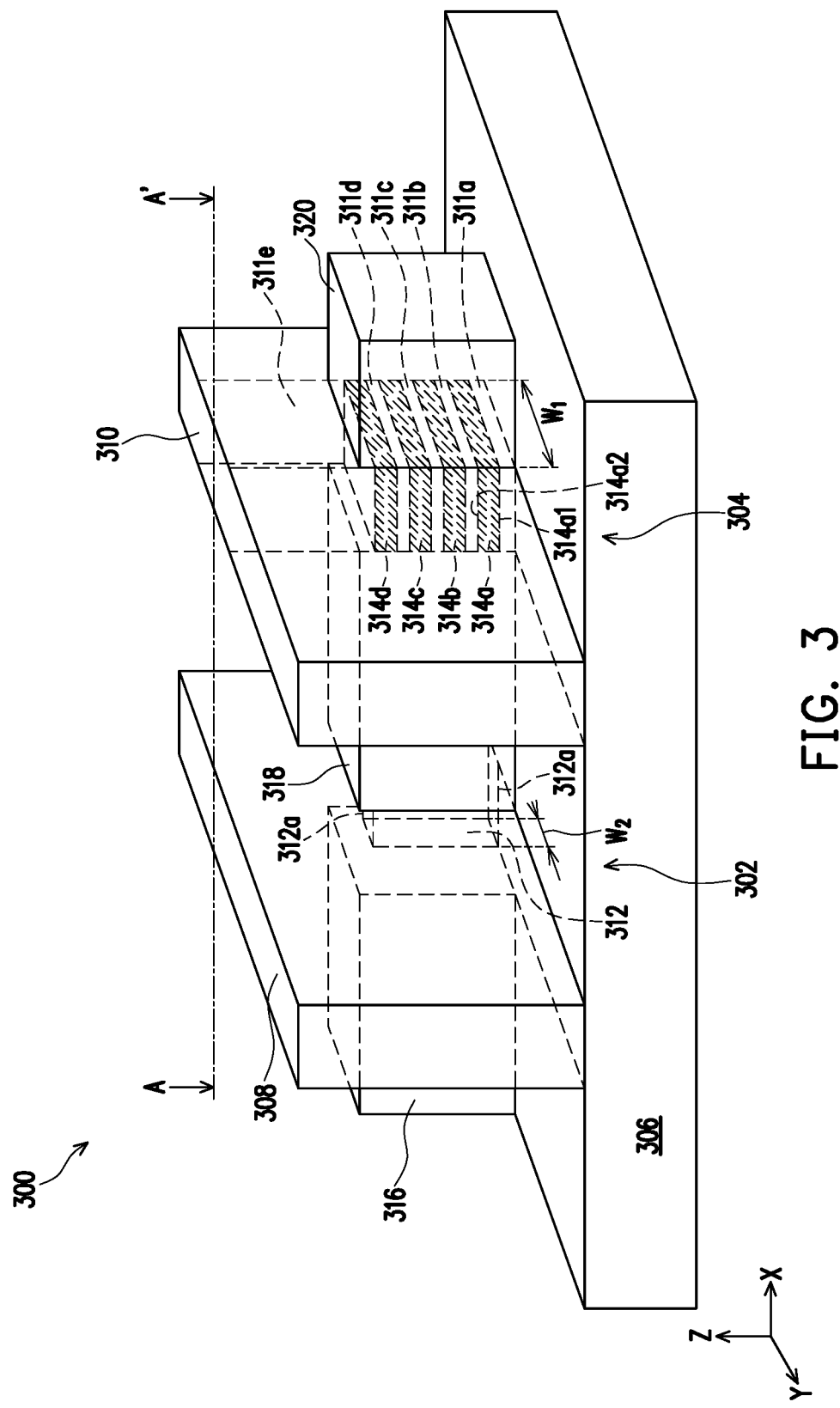
FIG. 3 illustrates a perspective view of a memory device, in accordance with some embodiments.

Referring to FIG. 3, a perspective view of an example memory device 300, including a fin-based transistor and a nanosheet transistor, is shown. In accordance with some embodiments, the memory device 300 may be a portion of an anti-fuse memory cell that includes a programming transistor and a reading transistor, e.g., the memory cell 100. The perspective view of FIG. 3 is an overview of the memory device 300 and thus, some of the features of the memory device 300 may not be identified in FIG. 3. More detailed features of the memory device 300 shall be shown and discussed below with respect to the cross-sectional views of FIGS. 5-22.

The memory device 300 includes a programming transistor 302 and a reading transistor 304. In some embodiments, the programming transistor 302 is configured as a fin-based transistor, and the reading transistor is configured as a nanosheet transistor. The programing transistor 302 and the reading transistor 304 may be formed on (or include) a semiconductor structure (e.g., a substrate) 306. For example, over the semiconductor structure 306, the memory device 300 includes a first gate structure 308 and a second gate structure 310. The first gate structure 308 and second gate structure 310, in parallel with each other, may be orientated and elongated along a first lateral direction (e.g., the Y direction). On respective sides of the first gate structure 308, a drain/source region 316 and a drain/source region 318 are formed. On respective sides of the second gate structure 310, the drain/source region 318 and a drain/source region 320 are formed. The first gate structure 308 is formed to straddle a fin-based structure 312 that is coupled to the drain/source regions 316 and 318 on respective ends. The second gate structure 310 is formed to wrap around a plurality of nanosheets 314a, 314b, 314c, and 314d that are coupled to the drain/source regions 318 and 320 on respective ends. In some embodiments, the fin-based structure 312 and the nanosheets 314a-d may be orientated and elongated along a second lateral direction (e.g., the X direction), which is the same as a direction along which the drain/source regions 316-320 are aligned with each other. As such, the drain/source regions 316-320, the fin-based structure 312, and the nanosheets 314a-d can be formed within the same active region (sometimes known as an "oxide definition (OD) region") on the semiconductor structure 306 (e.g., a semiconductor substrate/wafer). As shown, the nano sheets 314a-d can be characterized with a width (along the Y direction), $W_1$, and the fin-based structure 312 can be characterized with a width (along the Y direction), $W_2$, wherein W1 is substantially greater than $W_2$. In some other embodiments, $W_1$ may be equal or substantially similar to $W_2$.

The programming transistor 302 may be formed by the gate structure 308 (which functions as a gate of the transistor 302), the fin-shaped structure 312 (which functions as a conduction channel of the transistor 302), the drain/source region 316 (which functions as a drain of the transistor 302), and the source 318 (which functions as source of the transistor 302). The reading transistor 304 may be formed by the gate structure 310 (which functions as a gate of the transistor 302), the nano sheets 314a-d (which collectively function as a conduction channel of the transistor 304), the drain/source region 318 (which functions as a drain of the transistor 304), and the drain/source region 320 (which functions as a source of the transistor 304). The programming transistor 302 and the reading transistor 304 are electrically coupled to each other in series via the drain/source region 318.

In accordance with various embodiments of the present disclosure, the respective conduction channels of the programming transistor 302 (the fin-based structure 312) and the reading transistor 304 (the nano sheets 314a-d) may be characterized with respective different crystal lattice directions. For example, the fin-shaped structure 312 may have a <110> crystal lattice direction, and the nanosheets 314a-d may have a <100> crystal lattice direction. Specifically, respective "active planes" of the conduction channels of the programming transistor 302 and the reading transistor 304 may be characterized with respective different crystal planes. The term "active plane" may be referred to a plane along which a corresponding transistor conducts most of its current. For example, the programming transistor 302 may have an active plane along sidewalls 302a of the fin-based structure 302, and the reading transistor 304 may have an active plane along a top boundary and bottom boundary of each of the nanosheets (e.g., top boundary 314a1 and bottom boundary 314a2 of the nanosheet 314a). In some embodiments, the active plane (e.g., 312a) of the programming transistor 302 may be characterized with a {110} crystal plane (e.g., a (110) crystal plane), and the active plane (e.g., 314a1, 314a2) of the reading transistor 304 may be characterized with a {100} crystal plane (e.g., a (100) crystal plane).

Hereinafter, crystallography shall be briefly explained to facilitate an understanding of the embodiments of the present disclosure. In dealing with crystal structures, it is useful to refer to a lattice plane or a lattice direction. In a notation used for describing a plane or a direction, a set of three integers is adopted to indicate the position of a plane or the direction of a vector in a lattice. Three integers used to describe a certain plane in a crystal lattice may be determined as set forth below.

At the outset, intersections at which the certain plane meets three crystal axes are found and expressed as integer-folds of a basic vector. In this case, the plane may move while leaving its orientation intact, until the intersections between the plane and the crystal axes are found. The reciprocals of the intersections are taken, and a set of three integers h, k, and l, which has the smallest ratio of integers, is obtained while maintaining the same relationships. The three integers h, k, and l may be expressed using round brackets ( ).

The set of three integers h, k, and l is referred to as a Miller index and used to define parallel planes in a lattice. From the standpoint of crystallography, many planes in a lattice are equivalent. In other words, a certain plane having a given Miller index may move in a lattice only according to a method of selecting the position and orientation of a unit cell. That is, planes, which are symmetric with respect to a crystal lattice axis, are called equivalent planes in the crystallographic aspect. The crystallographically equivalent planes are expressed using squiggled brackets { } instead of round brackets ( ). For example, a crystal plane {100} includes a number of equivalent crystal planes: (100), (010), and (001). In another example, a crystal plane {110} includes a number of equivalent crystal planes: (110), (011), and (101).

Meanwhile, a direction in a lattice is indicated as a set of three integers that have the same relationship as components of a vector having the direction. Three components of the vector are expressed as products of a basic vector, converted into the smallest ratio of integers, and expressed using square brackets [ ]. Like the lattice plane, many directions in a lattice are equivalent, and equivalent directions are expressed using angled brackets < >. For example, a crystal lattice direction <100> includes a number of equivalent crystal lattice directions: [100], [010], [001], [1̄00], [01̄0], and [001̄]. In another example, a crystal lattice direction <110> includes a number of equivalent crystal lattice directions: [110], [101], [011], [1̄10], [11̄0], [1̄01], [101̄], [011̄], and [01̄1].

From the foregoing outline of crystallography, it can be seen that, for a cubic crystal (e.g., silicon), a crystal plane (001) is at a right angle to a crystal plane (110), which corresponds to a crystal lattice direction [110]. In other words, a crystal plane {100} is at a right angle to a crystal plane {110}, which corresponds to a crystal lattice direction <110>. Thus, when a substrate having a crystal plane {100} is etched in a crystal lattice direction <110>, the etched section of the substrate has the crystal plane {110}. When a substrate having a crystal plane {111} is cut in a crystal lattice direction <100>, the cut section of the substrate has a crystal plane {100}. When a substrate having a crystal plane {111} is cut in a crystal lattice direction <110>, the cut section of the substrate has a crystal plane {110}.

Referring again to FIG. 3, and in further detail, the gate structure 310 can include multiple gate stacks. Each of the gate stacks may include one or more gate dielectrics and one or more gate metals (not shown in FIG. 3 for clarity). Two of the gate stacks are configured to collectively wrap around a corresponding one of the one or more nano sheets. For instance, the gate structure 310 includes gate stacks 311a, 311b, 311c, 311d, and 311e. The gate stacks 311a-e may have a width (along the Y direction) substantially similar as a width of the gate structure 310 (along the Y direction), and the nano sheets 314a-d are characterized with a width $W_1$ (along the Y direction) less than the width of the gate stacks 311a-e. Each of the gate stacks 311a-e may further include portions that extend along the Z direction to be in contact with an adjacent gate stack. As such, two adjacent ones of the gate stacks 311a-e can wrap the full perimeter of a corresponding one of the nanosheets 314a-d.

For example, the gate stacks 311a and 311b can collectively wrap around at least four sides of the nanosheet 314a, with two sides of the nanosheet 314a respectively coupled to the drain/source region 318 and drain/source region 320; the gate stacks 311b and 311c can collectively wrap around at least four sides of the nanosheet 314b, with two sides of the nanosheet 314b respectively coupled to the drain/source region 318 and drain/source region 320; the gate stacks 311c and 311d can collectively wrap around at least four sides of the nanosheet 314c, with two sides of the nanosheet 314c respectively coupled to the drain/source region 318 and drain/source region 320; and the gate stacks 311d and 311e can collectively wrap around at least four sides of the nanosheet 314d, with two sides of the nanosheet 314d respectively coupled to the drain/source region 318 and drain/source region 320.

Figure 4:
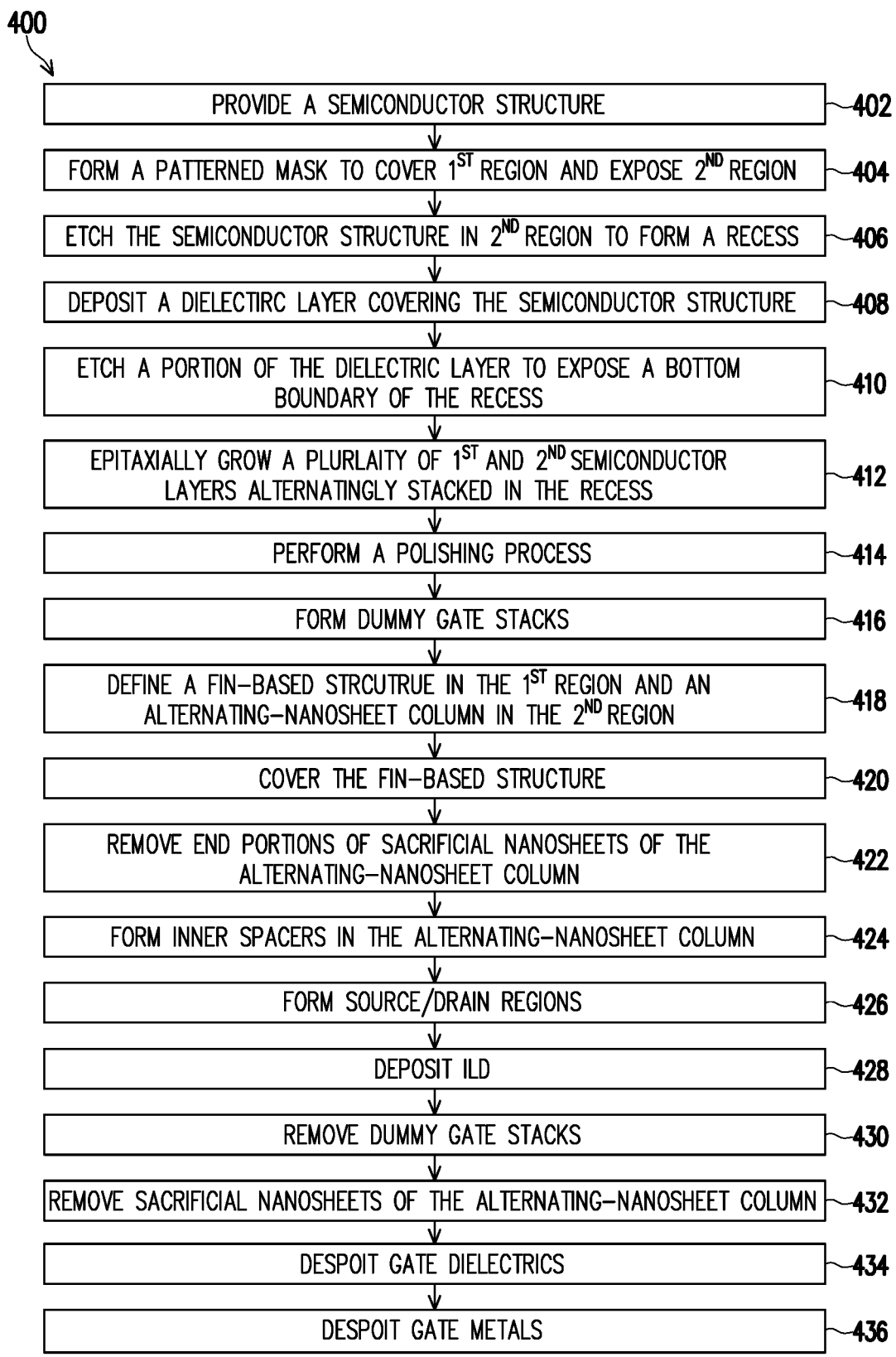
FIG. 4 illustrates a flow chart of an example method to fabricate a memory device, in accordance with some embodiments.

FIG. 4 illustrates a flowchart of a method 400 to form a memory device, according to one or more embodiments of the present disclosure. The method 400 may be used to form an anti-fuse memory cell, including a fin-based programming transistor and a nanosheet reading transistor, coupled in series. For example, at least some of the operations described in the method 400 may be used to form the memory device 300. It is noted that the method 400 is merely an example, and is not intended to limit the present disclosure. Accordingly, it is understood that additional operations may be provided before, during, and after the method 400 of FIG. 4, and that some other operations may only be briefly described herein.

The operations of the method 400 may be associated with cross-sectional views of the memory device 300, cut along line A-A', at respective fabrication stages as shown in FIGS. 5, 6, 7, 8, 9, 10, 11, 12, 13, 14, 15, 16, 17, 18, 19, 20, 21, and 22. In some embodiments, the memory device 300 may be included in or otherwise coupled to a microprocessor, another memory device, and/or other integrated circuit (IC). Also, FIGS. 5-22 are simplified for a better understanding of the concepts of the present disclosure. Although the figures illustrate the memory device 300, it is understood the IC may include a number of other devices such as inductors, resistor, capacitors, transistors, etc., which are not shown in FIGS. 5-22, for purposes of clarity of illustration.

Referring first to FIG. 4, in brief overview, the method 400 starts with operation 402 in which a semiconductor structure is provided. The method 400 proceeds to operation 406 in which a patterned mask is formed to cover a first region of the semiconductor substrate and expose a second region of the semiconductor structure. The method 400 proceeds to operation 408 in which a recess is formed by etching the semiconductor structure in the second region. The method 400 proceeds to operation 410 in which a dielectric layer is deposited to cover the semiconductor structure. The method 400 proceeds to operation 412 in which a portion of the dielectric layer is etched to expose a bottom boundary of the recess. The method 400 proceeds to operation 414 in which a plurality of first and second semiconductor layers, alternatingly stacked in the recess, are epitaxially grown. The method 400 proceeds to operation 416 in which a polishing process is performed. The method 400 proceeds to operation 418 in which dummy gate stacks are formed. The method 400 proceeds to operation 420 in which the fin-based structure is covered. The method 400 proceeds to operation 422 in which end portions of the first semiconductor layers of the alternating-nanosheet column are removed. The method 400 proceeds to operation 424 in which inner spacers in the alternating-nanosheet column are formed. The method 400 proceeds to operation 426 in which drain/source regions are formed. The method 400 proceeds to operation 428 in which an interlayer dielectric (ILD) material is deposited. The method 400 proceeds to operation 430 in which the dummy gate stacks are removed. The method 400 proceeds to operation 432 in which the first semiconductor layers of the alternating-nanosheet column are removed. The method 400 proceeds to operation 434 in which gate dielectrics are deposited. The method 400 proceeds to operation 436 in which gate metals are deposited.

Figure 5:
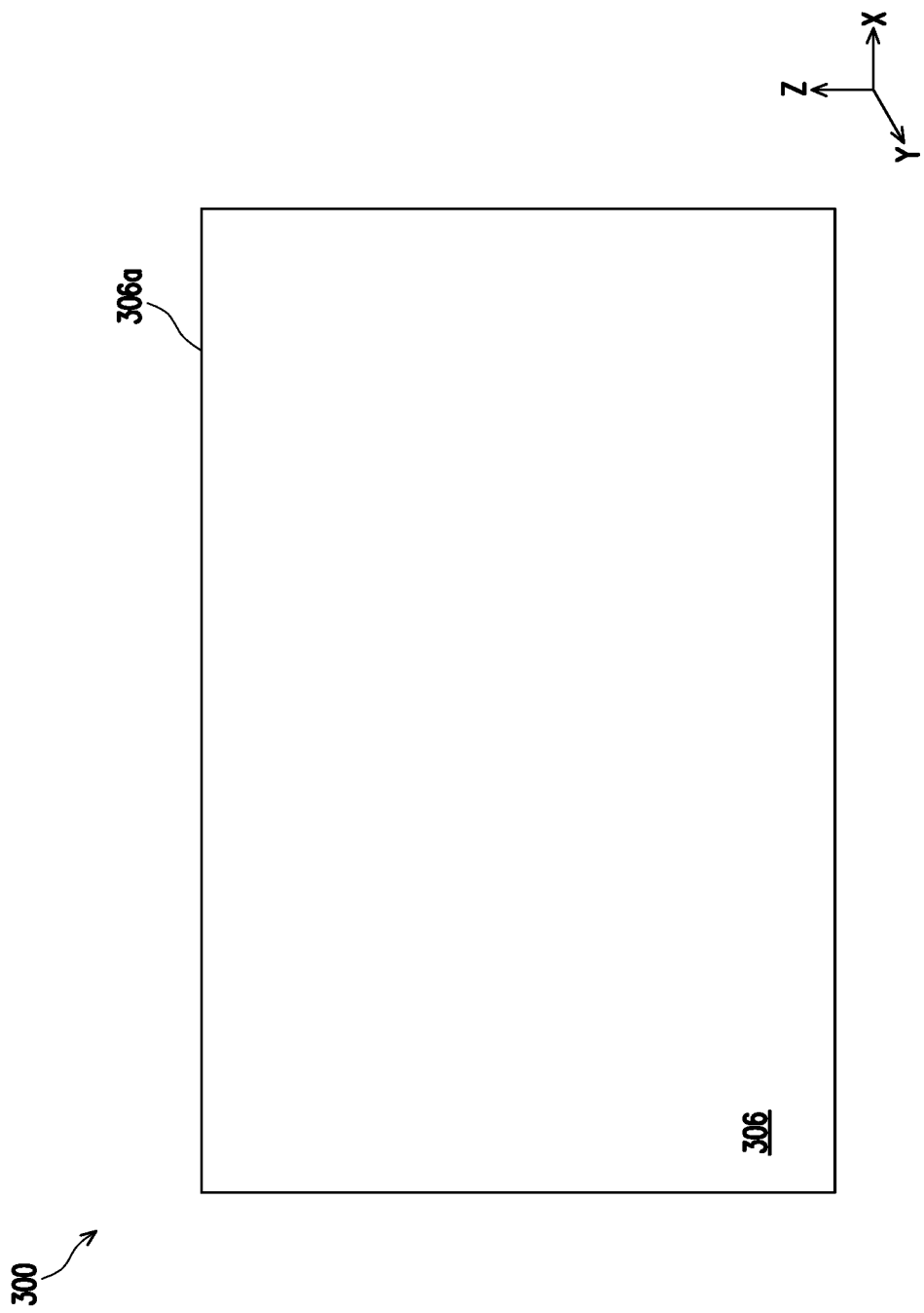
FIGS. 5, 6, 7, 8, 9, 10, 11, 12, 13, 14, 15, 16, 17, 18, 19, 20, 21, and 22 illustrate cross-sectional views of a memory device, made by the method of FIG. 4, at various fabrication stages, in accordance with some embodiments.

Corresponding to operation 402, FIG. 5 is a cross-sectional view of the memory device 300, cut along line A-A' (FIG. 3), that includes the semiconductor structure 306, at one of the various stages of fabrication. The semiconductor structure 306 includes a semiconductor material substrate, for example, silicon. In the present embodiment, based on the above-described outline of crystallography, the crystal structure of such a silicon substrate has a top boundary 306a in a {100} crystal plane (e.g., a (100) crystal plane). Alternatively, the semiconductor structure 306 may include other elementary semiconductor material such as, for example, germanium. The semiconductor structure 306 may also include a compound semiconductor such as silicon carbide, gallium arsenic, indium arsenide, and indium phosphide. The semiconductor structure 306 may include an alloy semiconductor such as silicon germanium, silicon germanium carbide, gallium arsenic phosphide, and gallium indium phosphide. In one embodiment, the semiconductor structure 306 includes an epitaxial layer. For example, the semiconductor structure 306 may have an epitaxial layer overlying a bulk semiconductor. Furthermore, the semiconductor structure 306 may include a semiconductor-on-insulator (SOI) structure. For example, the semiconductor structure 306 may include a buried oxide (BOX) layer formed by a process such as separation by implanted oxygen (SIMOX) or other suitable technique, such as wafer bonding and grinding.

Figure 6:
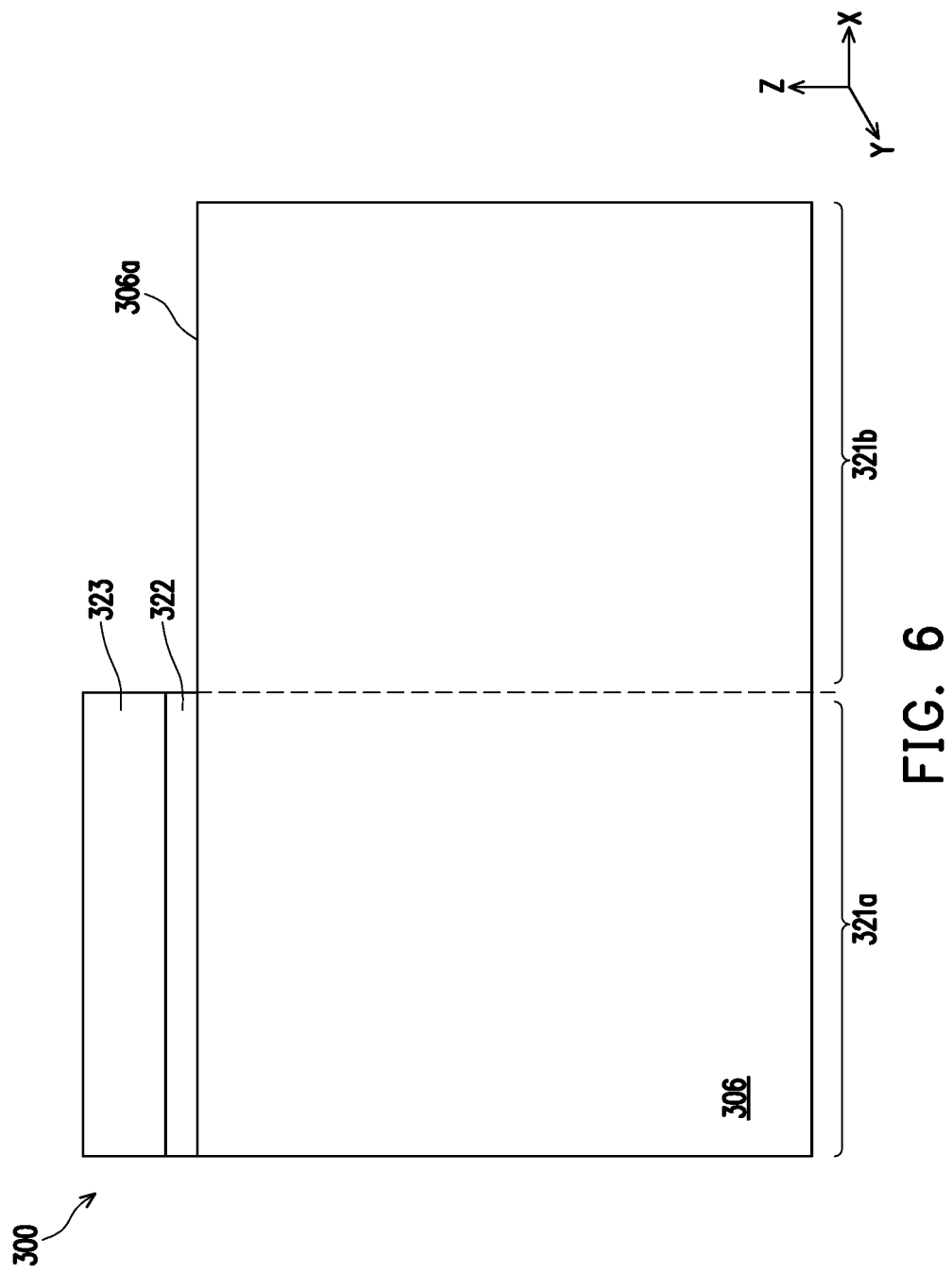

Corresponding to operation 404, FIG. 6 is a cross-sectional view of the memory device 300, cut along line A-A' (FIG. 3), that includes a patterned mask on the top boundary 306a of the semiconductor structure 306, at one of the various stages of fabrication. The patterned mask covers a first region 321a and includes an opening that exposes a second region 321b of the semiconductor structure 306. In an embodiment, the first region 321a is a region of the semiconductor structure 306 defined for one or more programming transistors (e.g., 302 shown in FIG. 3), which are configured as n-type transistors, and the second region 321b is a region of the semiconductor structure 306 defined for one or more reading transistors (e.g., 301 shown in FIG. 3), which are also configured as n-type transistors. It is understood that the semiconductor device 300 may alternatively have p-type transistors form in the regions 321a-b.

The patterned mask may be a soft mask such as a patterned resist layer, or a hard mask such as a dielectric material layer, or a combination thereof. In one embodiment, the patterned mask includes a hard mask 322 disposed on the region 321a and a patterned resist layer 323 formed on the hard mask 322 by a lithography process. The hard mask 322 is etched to transfer the opening from the patterned resist layer 323 to the hard mask 322. For example, the hard mask 322 includes silicon oxide, silicon nitride, silicon oxynitride, silicon carbide, silicon carbide nitride, silicon carbide oxynitride, other semiconductor material, and/or other dielectric material. In an embodiment, the hard mask 322 has a thickness ranging from about 1 nm to about 40 nm. The hard mask 322 may be formed by thermal oxidation, chemical vapor deposition (CVD), atomic layer deposition (ALD), or any other appropriate method. An exemplary photolithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In some embodiments, the patterned resist layer 323 may be directly used as an etch mask for the subsequent etch process. The patterned resist layer 323 may be removed by a suitable process, such as wet stripping or plasma ashing, after the patterning of the hard mask 322.

Figure 7:
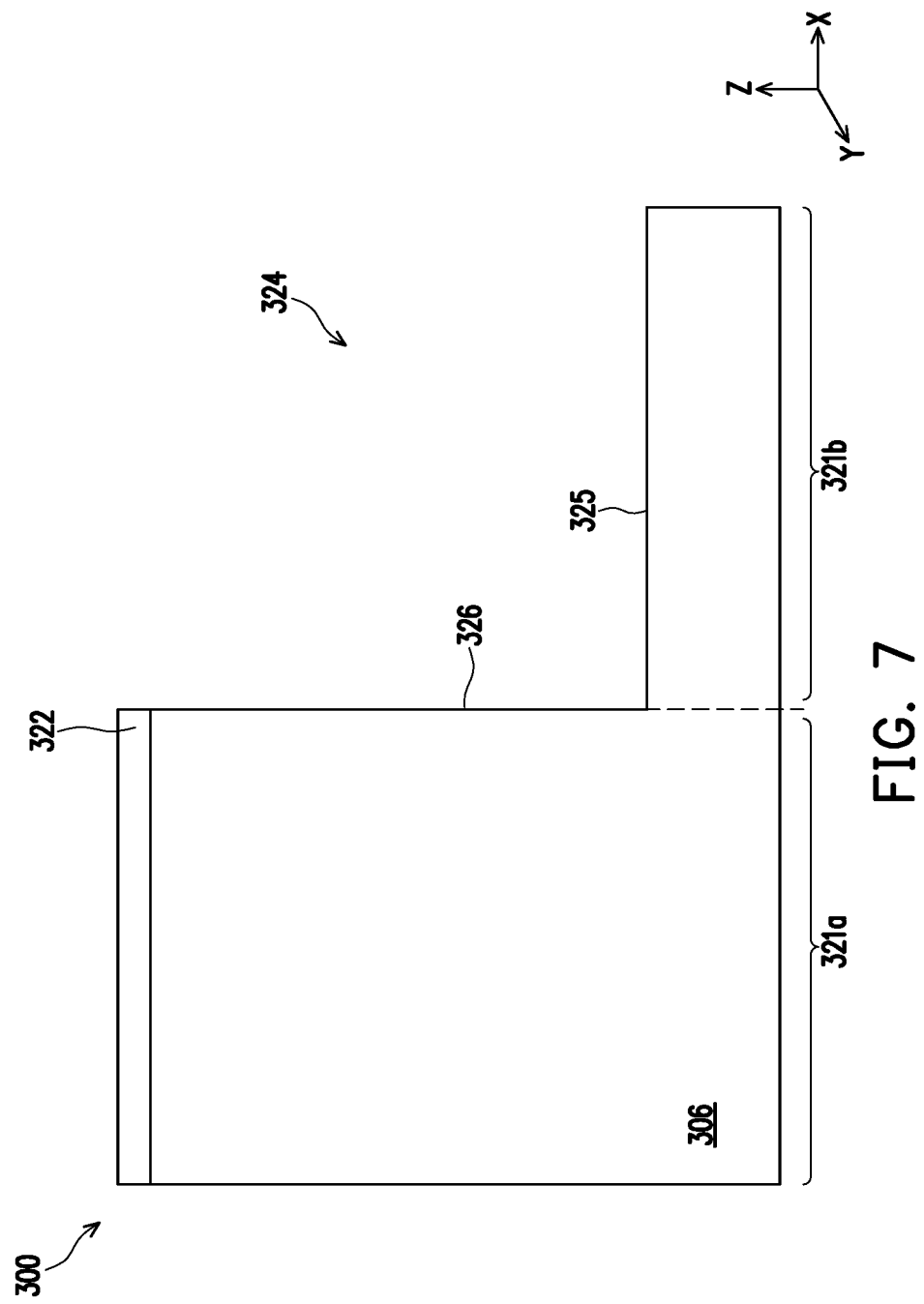

Corresponding to operation 406, FIG. 7 is a cross-sectional view of the memory device 300, cut along line A-A' (FIG. 3), in which the semiconductor structure 306 is etched to form a recess 324, at one of the various stages of fabrication. The semiconductor structure 306 in the second region 321b is etched to form the recess 324. The etching process is designed to selectively remove the semiconductor structure 306 in the second region 321b using the hard mask 322 as an etch mask. The etching process may be continued to ensure a boundary 325 of the semiconductor structure 306 is exposed in the recess 324. A sidewall 326 of the semiconductor structure 306 in the first region 321a is also exposed defining an edge of the recess 324. The etching process may include dry etch, wet etch, or a combination thereof. The patterned mask 322 protects the semiconductor structure 306 within the first region 321a from etching. In various examples, the etching process may include a dry etch with a suitable etchant, such as fluorine-containing etching gas or chlorine-containing etching gas, such as $Cl_2$, $CCl_2F_2$, $CF_4$, $SF_6$, $NF_3$, $CH_2F_2$ or other suitable etching gas. In some other examples, the etching process may include a wet etch with a suitable etchant, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. The etching process may include more than one step.

Figure 8:
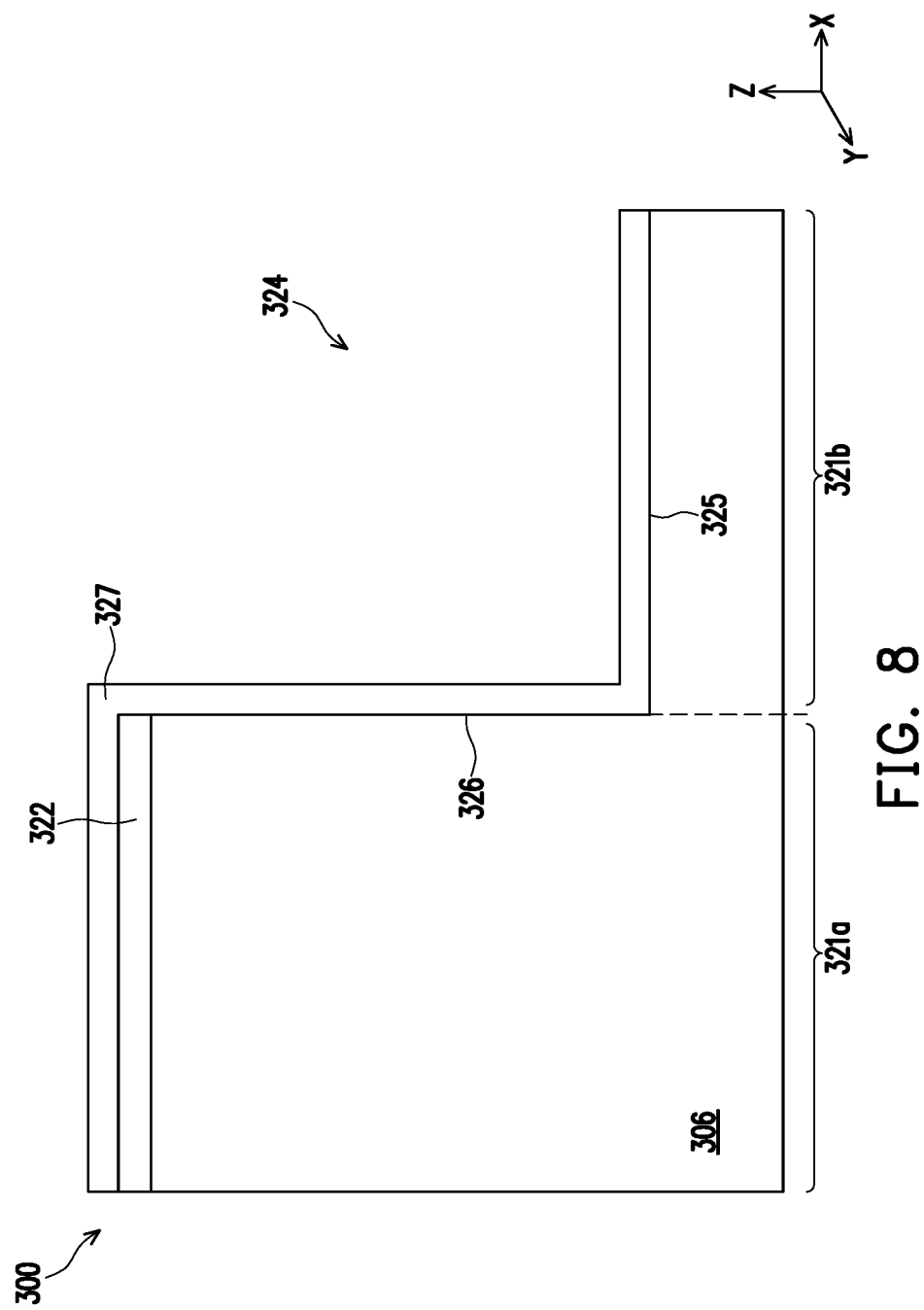

Corresponding to operation 408, FIG. 8 is a cross-sectional view of the memory device 300, cut along line A-A' (FIG. 3), that includes a dielectric layer 327, at one of the various stages of fabrication. The dielectric layer 327 may conformally cover the memory device 300 in both of the regions 321a-b. The dielectric layer 327 is deposited as a blanket layer. In an embodiment, the dielectric layer 327 has a thickness ranging from about 1 nm to about 40 nm. The dielectric layer 327 may include semiconductor oxide, semiconductor nitride, semiconductor oxynitride, semiconductor carbide nitride, semiconductor carbide oxynitride, and metal oxide, such as hafnium oxide, zirconium oxide, and aluminum oxide, other dielectric, and/or other suitable material. The dielectric layer 327 may be selected to have different etch selectivity from the hard mask 322. In an example, the hard mask 322 includes silicon oxide and the dielectric layer 327 includes silicon nitride. In another example, the hard mask 322 includes silicon oxynitride and the dielectric layer 327 includes aluminum oxide. In yet another example, the hard mask 322 includes silicon carbide oxynitride and the dielectric layer 327 includes zirconium oxide. The dielectric layer 327 may be deposited over the hard mask 322, the sidewall 326, and the boundary 325 of the semiconductor structure 306 by any suitable process including atomic layer deposition (ALD), chemical vapor deposition (CVD), plasma-enhanced CVD (PECVD), or other suitable deposition techniques. Conformal deposition techniques may be used.

Figure 9:
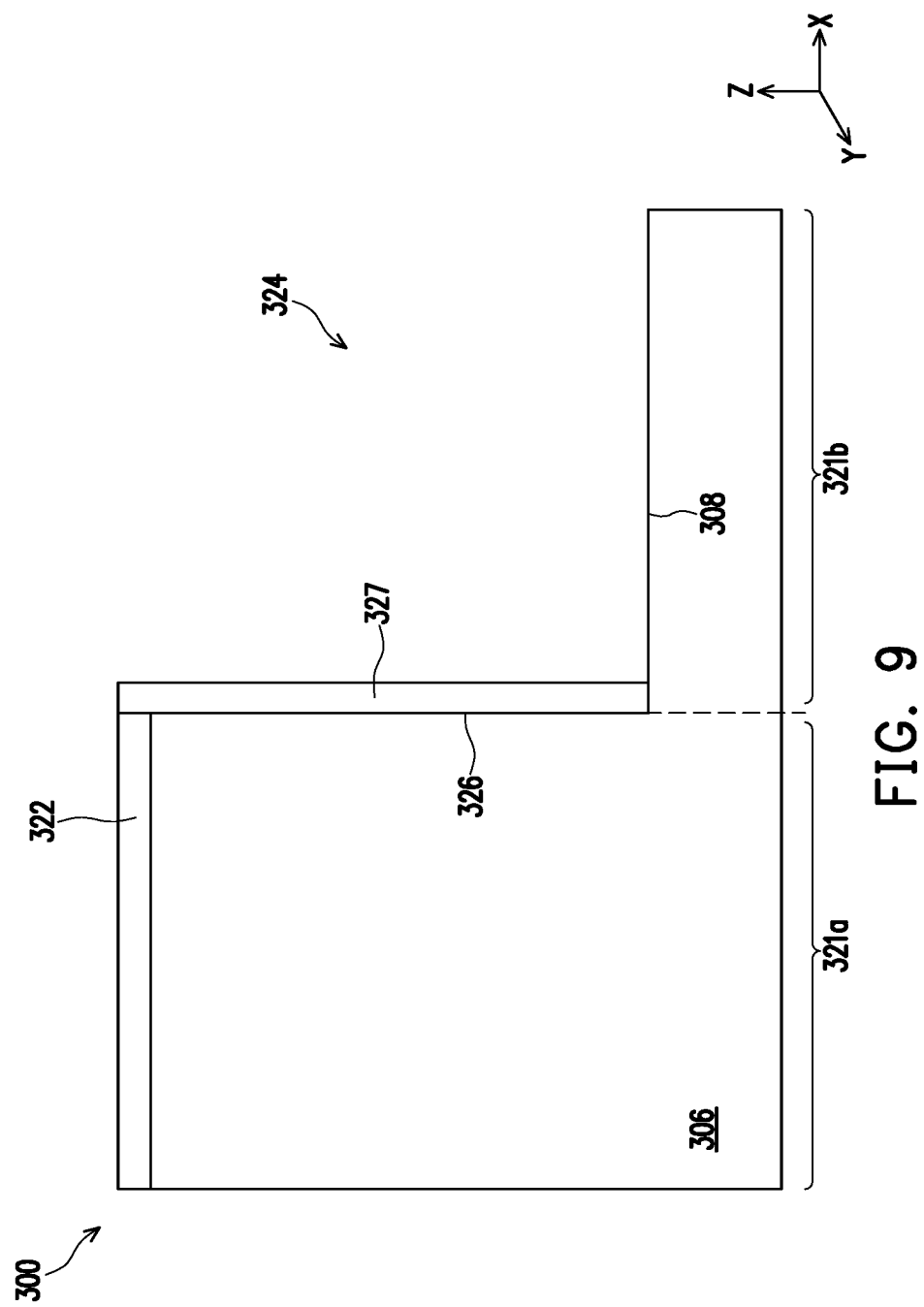

Corresponding to operation 410, FIG. 9 is a cross-sectional view of the memory device 300, cut along line A-A' (FIG. 3), in which one or more portions of the dielectric layer 327 is removed, at one of the various stages of fabrication. In some embodiments, portions of the dielectric layer 327 deposited on a horizontal boundary of the memory device 300 are removed (e.g., the portion of the dielectric layer 327 covering the hard mask 322, the portion of the dielectric layer 327 covering the boundary 308), while the sidewall 326 of the semiconductor structure 306 in the first region 321a remains covered by the remaining portions of the dielectric layer 327.

To perform the removal, an anisotropic etching, such as a dry or plasma etching, may be performed to etch back and remove those portions of the dielectric layer 327 deposited on the horizontal surfaces of the hard mask 322 and the boundary 308 of the semiconductor structure 306. In this way, only those portions of the dielectric layer 327 deposited on the sidewall 306 remain. Due to different etch sensitivity of each feature, the portion of the dielectric layer 327 is selectively etched without etching (or without significantly etching) the hard mask 322. Various etching parameters can be tuned to etch the dielectric layer 327, such as etchant composition, etching temperature, etching solution concentration, etching time, etching pressure, source power, RF bias voltage, RF bias power, etchant flow rate, other suitable etching parameters, or combinations thereof. In some embodiments, the thickness of the hard mask 322 is reduced about 5% to 15% after the anisotropic etching, such as from a thickness of about 40 nm down to about 35 nm. The dielectric layer 327 deposited on the sidewall 306 may also suffer from some material loss due to the anisotropic etching. In some embodiments, the thickness of the dielectric layer 327 is reduced about 8% to 20%, such as from a thickness of about 40 nm down to about 35 nm.

Figure 10:
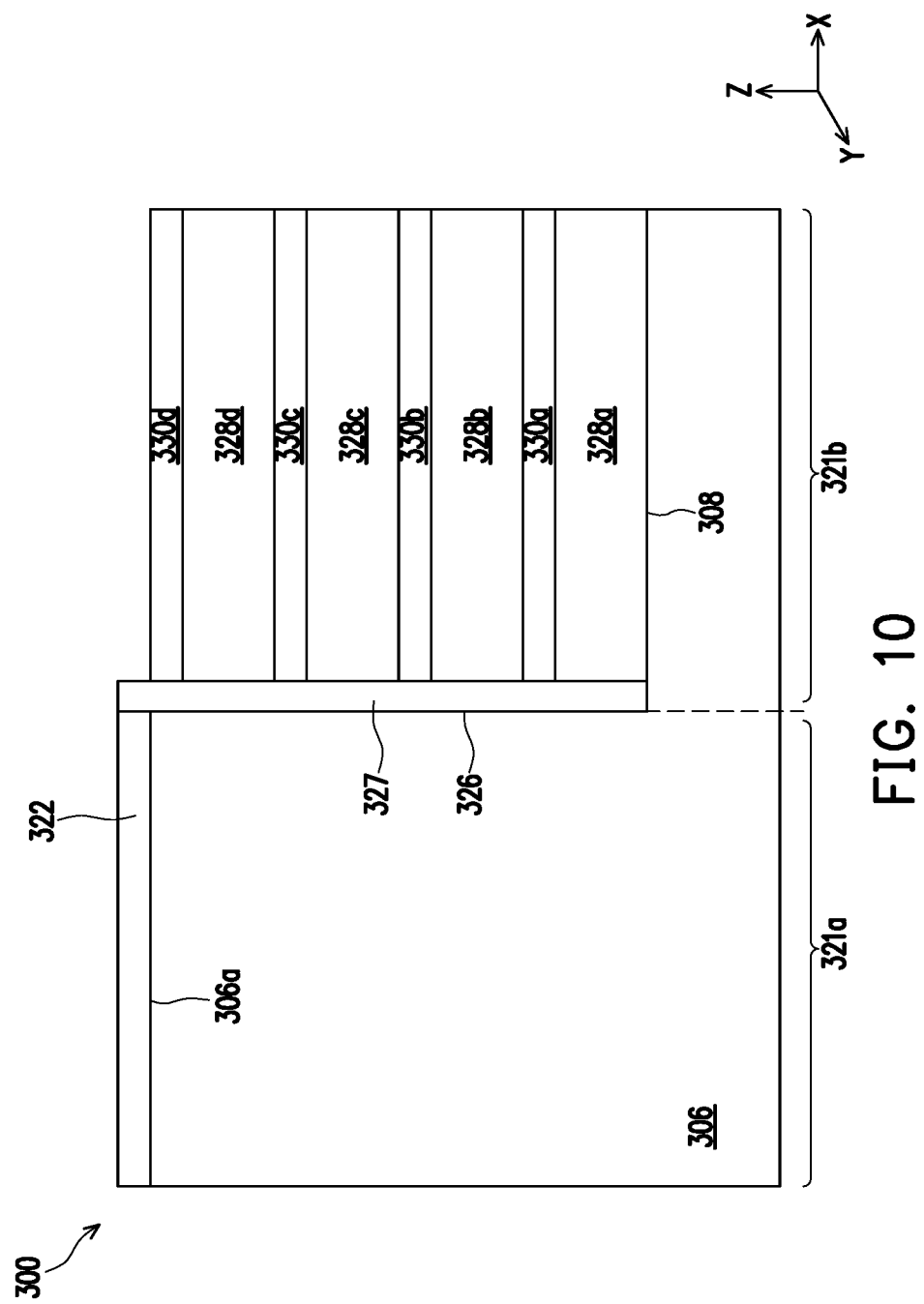

Corresponding to operation 412, FIG. 10 is a cross-sectional view of the memory device 300, cut along line A-A' (FIG. 3), that includes a number of first semiconductor layers 328 (e.g., 328a, 328b, 328c, and 328d) and a number of second semiconductor layers 330 (e.g., 330a, 330b, 330c, and 330d), at one of the various stages of fabrication. In some embodiments, the first semiconductor layers 328a-d and the second semiconductor layers 330a-d are alternatingly disposed on top of one another (e.g., along the Z direction) in the recess 324 (FIG. 9) to form a stack. For example, one of the second semiconductor layers 330a is disposed over one of the first semiconductor layers 328a, then another one of the second semiconductor layers 328b is disposed over the second semiconductor layer 330a, so on and so forth.

In various embodiments, the stack may include any number of alternately disposed semiconductor layers 328 and 330. The semiconductor layers 328 and 330 may have different thicknesses. The semiconductor layers 328 may have different thicknesses from one layer to another layer. The semiconductor layers 330 may have different thicknesses from one layer to another layer. The thickness of each of the semiconductor layers 328 and 330 may range from few nanometers to few tens of nanometers. The first layer of the stack may be thicker than other semiconductor layers 328 and 330. For example, the layer 328a may be thicker than other layers 328b-d and 330a-d. In an embodiment, each of the first semiconductor layers 228a-d has a thickness ranging from about 5 nm to about 20 nm, and each of the second semiconductor layers 330a-d has a thickness ranging from about 5 nm to about 20 nm.

The two semiconductor layers 328 and 330 have different compositions. In various embodiments, the two semiconductor layers 328 and 330 have compositions that provide for different oxidation rates and/or different etch selectivity between the layers. In an embodiment, the semiconductor layers 328 include silicon germanium ($Si_{1-x}Ge_x$), and the semiconductor layers 330 include silicon (Si). In an embodiment, each of the semiconductor layers 330 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the layers 328 (e.g., of silicon). Alternatively, the semiconductor layers 330 may be intentionally doped. For example, each of the semiconductor layers 330 may be silicon that is doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. In some embodiments, each of the semiconductor layers 328 is $Si_{1-x}Ge_x$ that includes less than 50% (x<0.5) Ge in molar ratio. For example, Ge may comprise about 15% to 35% of the semiconductor layers 328 of $Si_{1-x}Ge_x$ in molar ratio. Furthermore, the semiconductor layers 328 may include different compositions among them, and the semiconductor layers 330 may include different compositions among them.

In various embodiments, either of the semiconductor layers 328 and 330 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 328 and 330 may be chosen based on providing differing oxidation rates and/or etch selectivity. The semiconductor layers 328 and 330 may be doped or undoped, as discussed above.

In various embodiments, the semiconductor layers 328 and 330 are epitaxially grown from the boundary 308 of the semiconductor structure 306 in the second region 321b. For example, each of the semiconductor layers 328 and 330 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor structure 306 extends upwardly (e.g., along the Z direction), resulting in the semiconductor layers 328 and 330 having the same crystal orientation with the semiconductor structure 306.

In the first region 321a, the hard mask 322 functions as a capping layer on the top boundary 306a of the semiconductor structure 306, blocking epitaxial growth from taking place in the first region 321a. While in the second region 321b, the dielectric layer 327 covers the sidewall 306 thereby blocking epitaxial growth from originating from the sidewall 306 so that the epitaxially growth does not take place in lateral direction from the sidewall 306 into the second region 321b. Therefore, in some embodiments, the epitaxial growth of the semiconductor layers 328 and 330 are limited in the recess 324 (FIG. 9).

In various embodiments of the present disclosure, the crystal structure of the semiconductor structure 306 has the top boundary 306a in a {100} crystal plane. Accordingly, the epitaxially grown semiconductor layers 328 and 330 each has respective top/bottom boundaries in the same {100) crystal plane. In some other embodiments, the semiconductor structure 306 may have a top boundary in one of crystal planes different from the {100} crystal plane, such as in a {110} crystal plane. Accordingly, the epitaxially grown semiconductor layers 328 and 330 keep in the same crystal structure and exhibit the same {110} crystal plane in the respective top/bottom boundaries.

Figure 11:
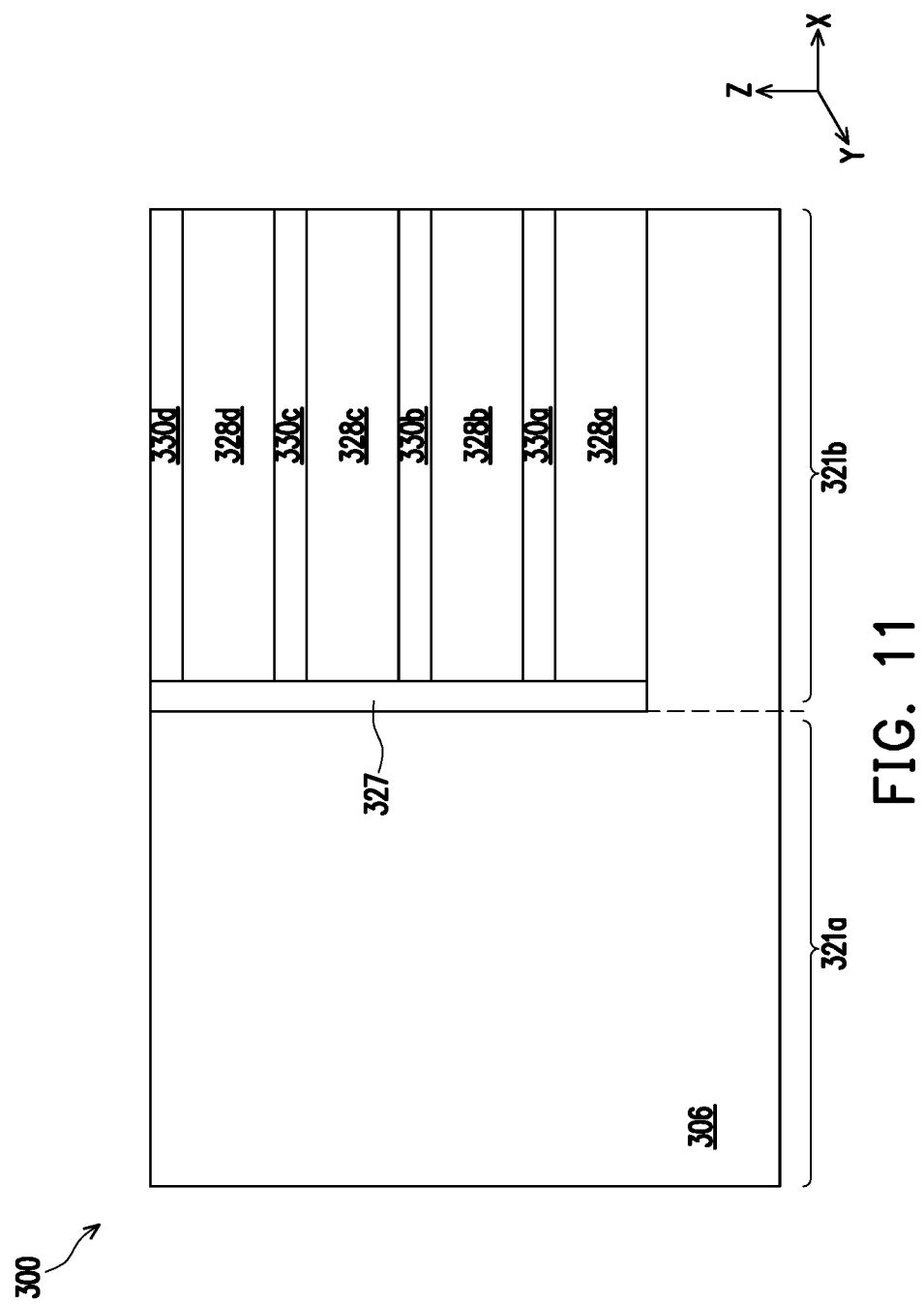

Corresponding to operation 414, FIG. 11 is a cross-sectional view of the memory device 300, cut along line A-A' (FIG. 3), in which a polishing process is performed, at one of the various stages of fabrication. The polishing process (e.g., a chemical mechanical polishing (CMP) process) is configured to planarize a top boundary of the semiconductor structure 306 after the epitaxial growth of the semiconductor layers 328 and 330. Referring again to FIG. 10, the hard mask 322 can function as a CMP stop layer at operation 414. The operation 414 can also remove the hard mask layer 322. As a result, the semiconductor structure 306 in the first region 321a is again exposed to form part of the top boundary of the semiconductor structure 306.

Figure 12:
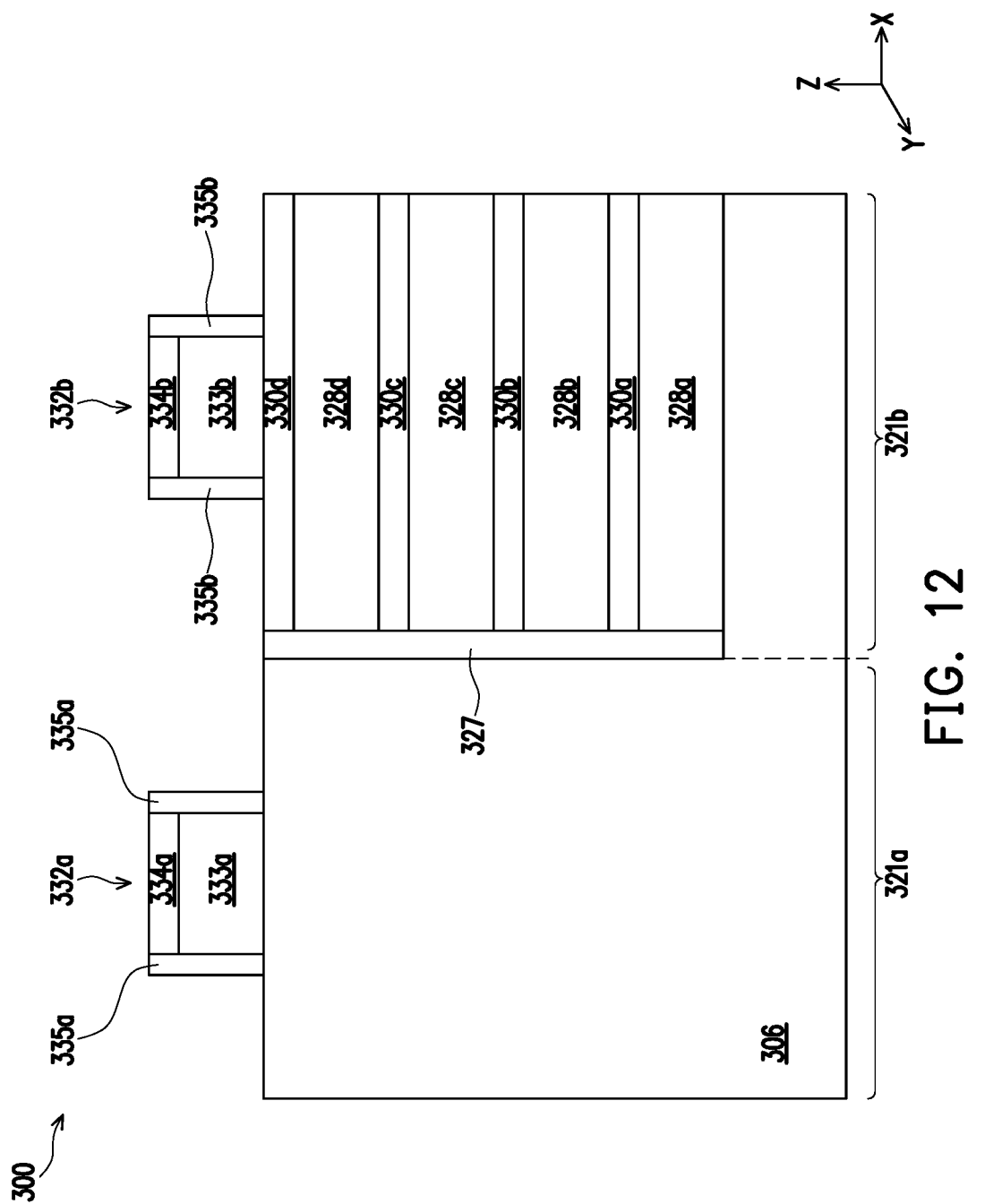

Corresponding to operation 416, FIG. 12 is a cross-sectional view of the memory device 300, cut along line A-A' (FIG. 3), that includes a first dummy gate stack 332a and a second dummy gate stack 332b, at one of the various stages of fabrication. Each of the dummy gate stacks 332a-b includes a dummy gate and a hard mask. For example in FIG. 12, the first dummy gate stack 332a includes a dummy gate 333a formed over the semiconductor structure 306 in the first region 321a, and a hard mask 334a formed over the dummy gate 333a; and the second dummy gate stack 332b includes a dummy gate 333a formed over the semiconductor layer 330d in the second region 321b, and a hard mask 334b formed over the dummy gate 333b.

In some embodiments, the dummy gate stack 332a may be formed over and around sidewalls of the semiconductor structure 306 in the first region 321a, and the dummy gate 332b may be formed over and around sidewalls of the semiconductor layers 328 and 330 in the second region 321b. The dummy gates 333a and 333b can be formed by depositing amorphous silicon (a-Si) over and around the semiconductor structure 306 in the first region 321a and the semiconductor layers 328 and 330 in the second region 321b, respectively. The a-Si is then planarized to a desired level. A hard mask (not shown) is deposited over the planarized a-Si and patterned to form the hard masks 334b and 334b. The hard masks 334b and 334b can be formed from a nitride or an oxide layer. An etching process (e.g., a reactive-ion etching (RIE) process) is applied to the a-Si to form the dummy gate stacks 332a and 332b.

After forming the dummy gate stacks 332a and 332b, offset gate spacers 335a and 335b may be formed to extend along respective sidewalls of the dummy gate stacks 332a and 332b, as illustrated in FIG. 12. The offset gate spacers 335a-b can be formed using a spacer pull down formation process. The offset gate spacers 335a-b can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Figure 13:
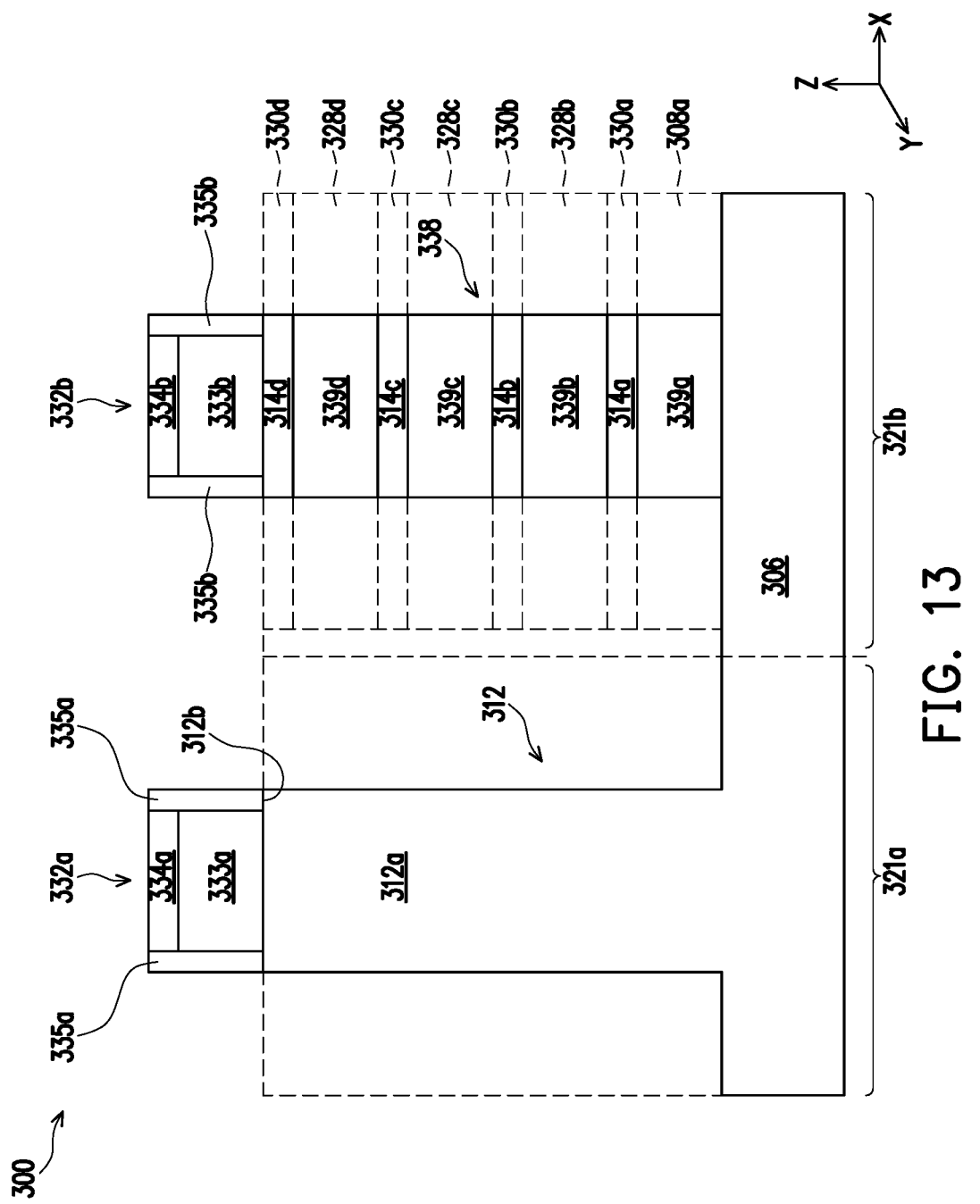

Corresponding to operation 418, FIG. 13 is a cross-sectional view of the memory device 300, cut along line A-A' (FIG. 3), that includes the fin-based structure 312 (shown in FIG. 3) and an alternating-nanosheet column 338, at one of the various stages of fabrication. The fin-based structure 312 and alternating-nanosheet column 338 are both formed to protrude from the remaining portion of the semiconductor structure 306. Specifically, the fin-based structure 312 is an integrally contiguous structure extended from the semiconductor structure 306. The fin-based structure 312 may be elongated along a lateral direction (e.g., the X direction). The alternating-nanosheet column 338 includes a stack of the nanosheets 314a-d (shown in FIG. 3) and nanosheets 339a, 339b, 339c, and 339d interleaved with the nanosheets 314a-d. In the formation of the fin-based structure 312 and the alternating-nanosheet column 338, the dummy gate stacks 332a-b together with the respective offset gate spacers 335a-b can be used as a mask to define the footprint of the fin-based structure 312 and the alternating-nanosheet column 338, and one or more etching processes can be applied to the semiconductor structure 306 in the first region 321a and the semiconductor layers 328 and 330 in the second region 321b (enclosed by the dotted lines), respectively, to form the fin-based structure 312 and the alternating-nanosheet column 338. As such, the nanosheets 339a, 314a, 339b, 314b, 339c, 314c, 339d, and 314d may be the remaining portions of the semiconductor layers 328a, 330a, 328b, 330b, 328c, 330c, 328d, and 330d, respectively.

The one or more etching processes may include one or more dry etching processes, wet etching processes, and other suitable etching techniques. For example, a dry etching process may implement an oxygen-containing gas, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid (HNO3), and/or acetic acid (CH3COOH), or other suitable wet etchant.

In some embodiments, the orientation of the dummy gate stack 332a may be set such that a top boundary 312b of the etched fin-based structure 312 has a {100} crystal plane and the sidewalls 312a (shown in FIG. 3) of the etched fin-based structure 312 each has a {110} crystal plane. In the above example where the crystal structure of the semiconductor structure 306 (e.g., a Si wafer) has the top boundary in the {100} crystal plane, the semiconductor structure 306 can have a flat zone in a {110} crystal plane, as manufactured. The orientation of the dummy gate stack 332a may be in parallel with or perpendicular to the flat zone. Accordingly, through the one or more etching processes (e.g., anisotropic etching processes), each of the sidewalls 312a of the fin-based structure 312 can be characterized with the same {110} crystal plane as the flat zone. Based on the foregoing outline of crystallography, the fin-based structure 312 may sometimes be referred to having a <110> crystal lattice direction, which includes crystal lattice directions: [110], [101], [011], [110], [110], [101], [101], [011], and [011]. As mentioned above, the respective top/bottom boundaries of the epitaxially grown semiconductor layers 328 and 330 each has the same {100} crystal plane. After the etching processes, respective top/bottom boundaries of the nanosheets 314a-d (e.g., 314a1 and 314a2 in FIG. 3) and 339a-d can inherit the same {100} crystal plane. The nanosheets 314a-d may sometimes be referred to having a <100> crystal lattice direction, which includes crystal lattice directions: [100], [010], [001], [100], [010], or [001].

Figure 14:
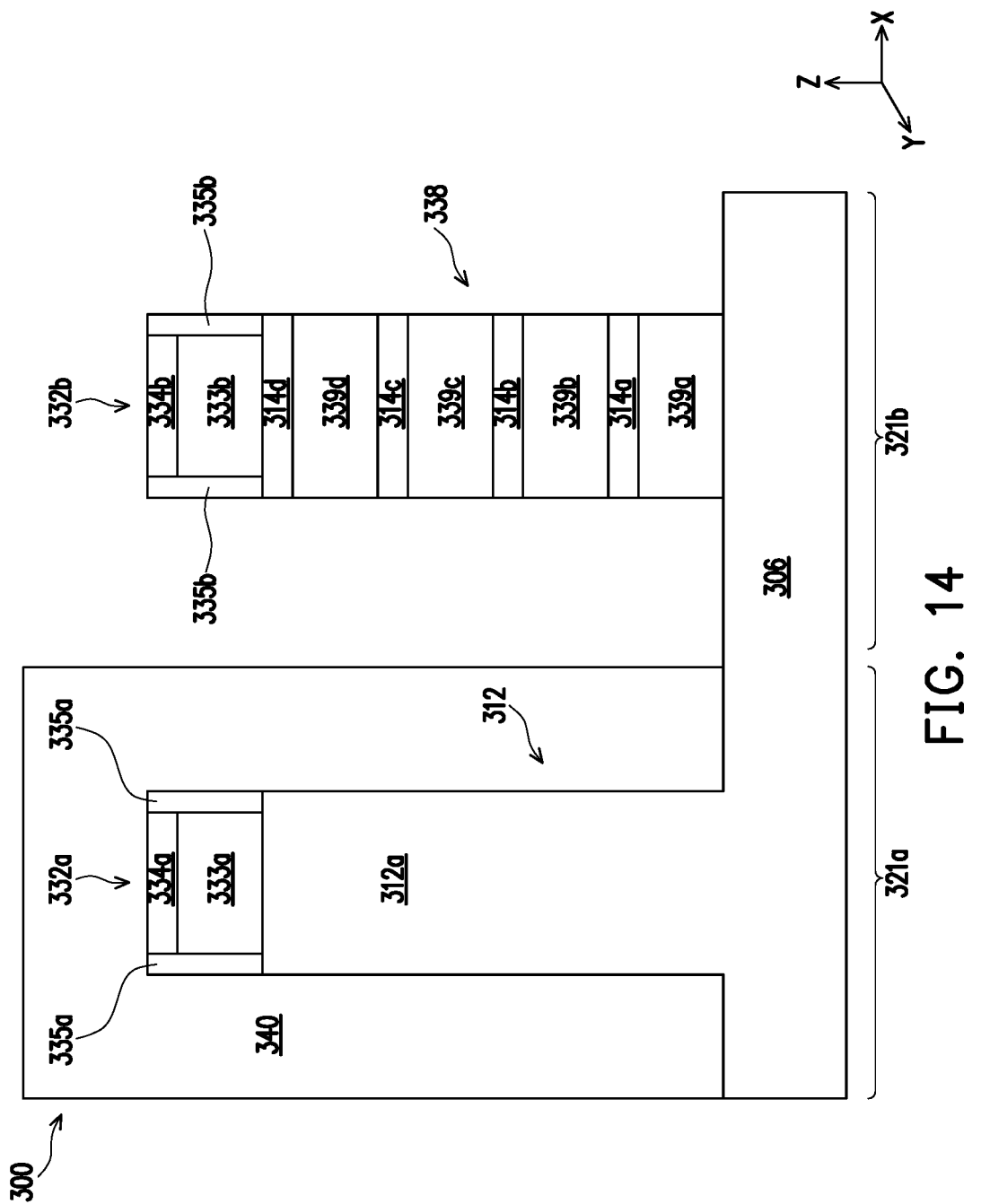

Corresponding to operation 420, FIG. 14 is a cross-sectional view of the memory device 300, cut along line A-A' (FIG. 3), in which the fin-based structure 312 is covered by a blocking mask 340, at one of the various stages of fabrication. In some embodiments, the blocking mask 340 is formed to overlay the fin-based structure 312 in the first region 321a while remaining the alternating-nanosheet columns 338 in the second region 321b exposed. The blocking mask 340 may be formed to have a sufficiently great thickness (or height) such that the sidewalls 312a of the fin-based structure 312 are fully covered. Formation of the blocking mask 340 may allow one or more processes, which shall be discussed below, to be performed on the alternating-nanosheet column 338 only. The blocking mask 340 may be formed of a material relatively resistant to etchants that can etch SiGe such as, for example, silicon oxide, silicon nitride, silicon oxynitride, SiBCN, SiOCN, SiOC, or any suitable combination of those materials.

Figure 15:
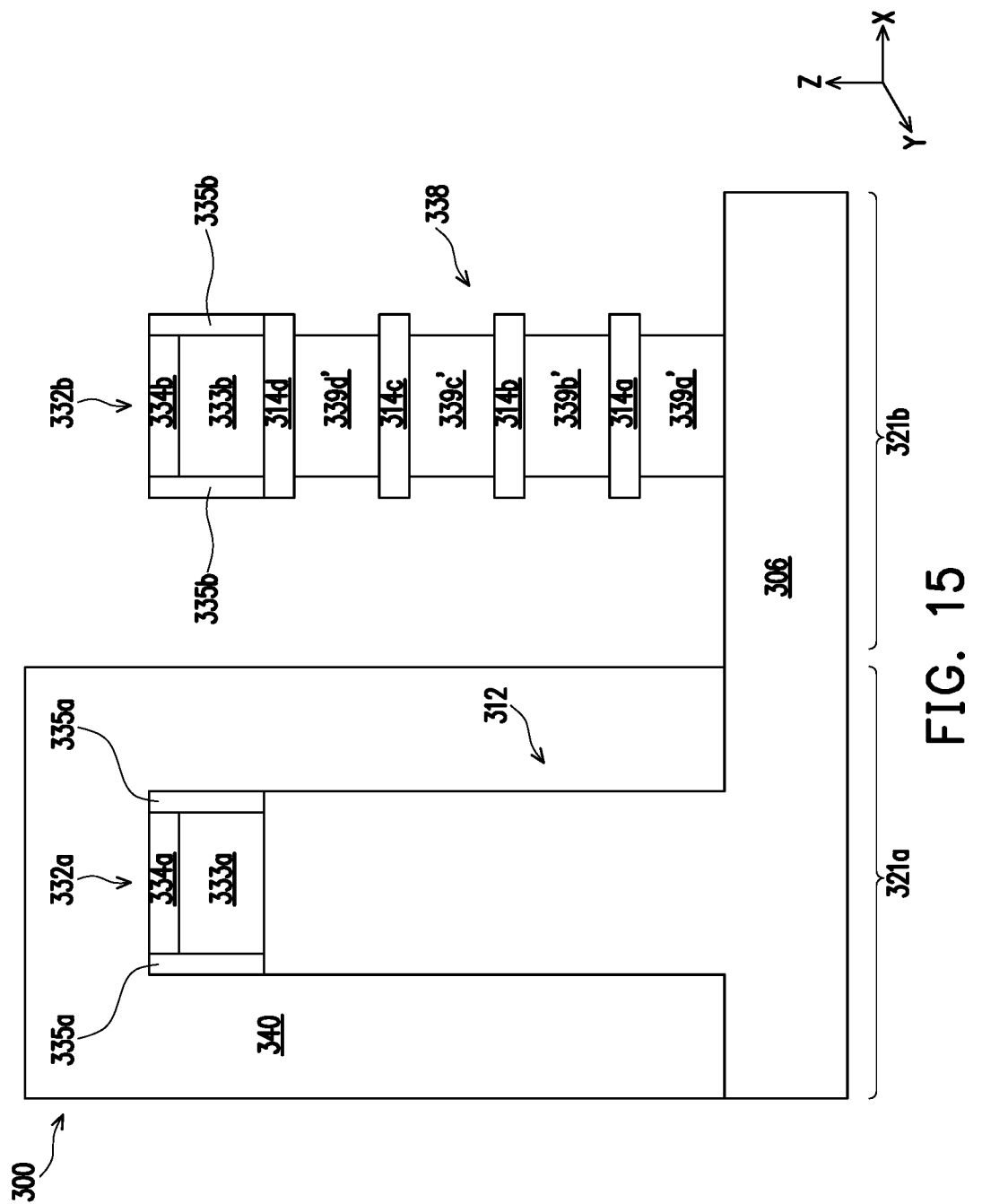

Corresponding to operation 422, FIG. 15 is a cross-sectional view of the memory device 300, cut along line A-A' (FIG. 3), in which respective end portions of each of the nanosheets 339a-d (FIG. 14) are removed, at one of the various stages of fabrication. During the removal of the respective end portions of the nanosheets 339a-d in the alternating-nanosheet column 338, the fin-based structure 312 is covered by the blocking mask 340. As such, the fin-based structure 312 can remain intact. Remaining nanosheets 339a', 339b', 339c', and 339d' may be later replaced by a number of gate stacks. Thus, the remaining nanosheets 339a'-d' may be herein referred to as sacrificial nanosheets 339a'-d'. for the alternating-nanosheet column 338.

In some embodiments of present disclosure, the end portions of the nanosheets 339a-d can be removed using a first application, so called a "pull-back" process to pull the nanosheets 339a-d back an initial pull-back distance such that the ends of the sacrificial nanosheets 339a'-d' terminate underneath (e.g., aligned with) the offset gate spacers 335b. Although in the illustrated embodiment of FIG. 15, the ends of each of the sacrificial nanosheets 339a'-d' are approximately aligned with the sidewalls of the offset gate spacer 335b, it is understood that the pull-back distance (i.e., the extent to which each of the sacrificial nanosheets 339a'-d' is etched, or pulled-back) can be arbitrarily increased or decreased. In accordance with various embodiments of the present disclosure, the nanosheets 314a-d includes Si, and the nanosheets 339a-d includes $Si_{1-x}Ge_x$. As such, the pull-back process may include a hydrogen chloride (HCL) gas isotropic etch process, which etches SiGe without attacking Si.

Figure 16:
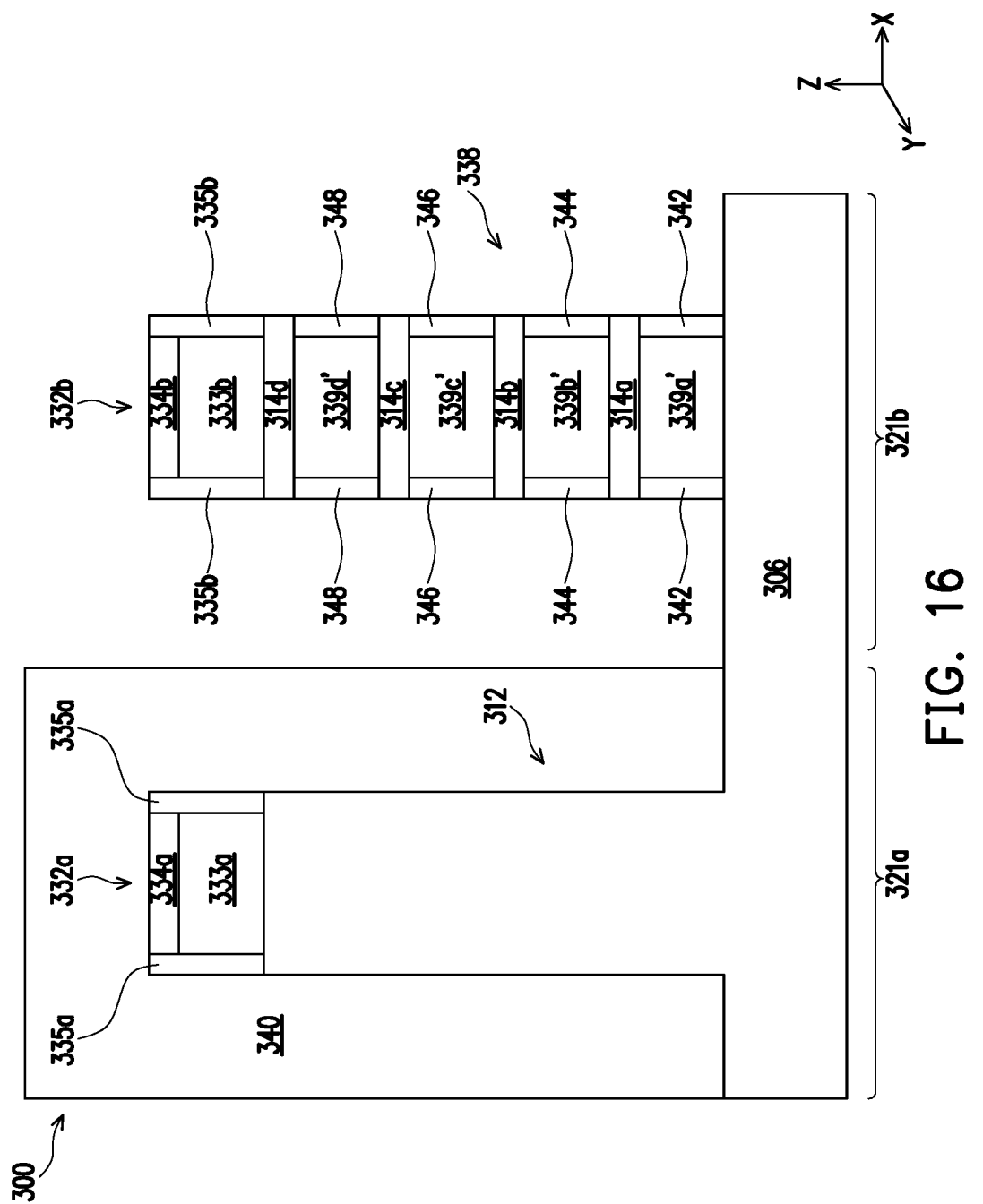

Corresponding to operation 424, FIG. 16 is a cross-sectional view of the memory device 300, cut along line A-A' (FIG. 3), that includes inner spacers 342, 344, 346, and 348, at one of the various stages of fabrication. During the formation of the inner spacers 342-348, the fin-based structure 312 is still covered by the blocking mask 340. As such, only the alternating-nanosheet column 338 has inner spacers 342-348 disposed along respective sidewalls of the sacrificial nanosheets 339a'-d'. In some embodiments, the inner spacers 342-348 can be formed conformally by chemical vapor deposition (CVD), or by monolayer doping (MLD) of nitride followed by spacer RIE. In some other embodiments, the inner spacers 342-348 can be deposited using, e.g., a conformal deposition process and subsequent isotropic or anisotropic etch back to remove excess spacer material on vertical sidewalls of the alternating-nanosheet column 318 and on a surface of the semiconductor structure 306. A material of the inner spacers 342-348 can be formed from the same or different material as the offset gate spacer 335a-b (e.g., silicon nitride). For example, the inner spacers 342-348 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 17:
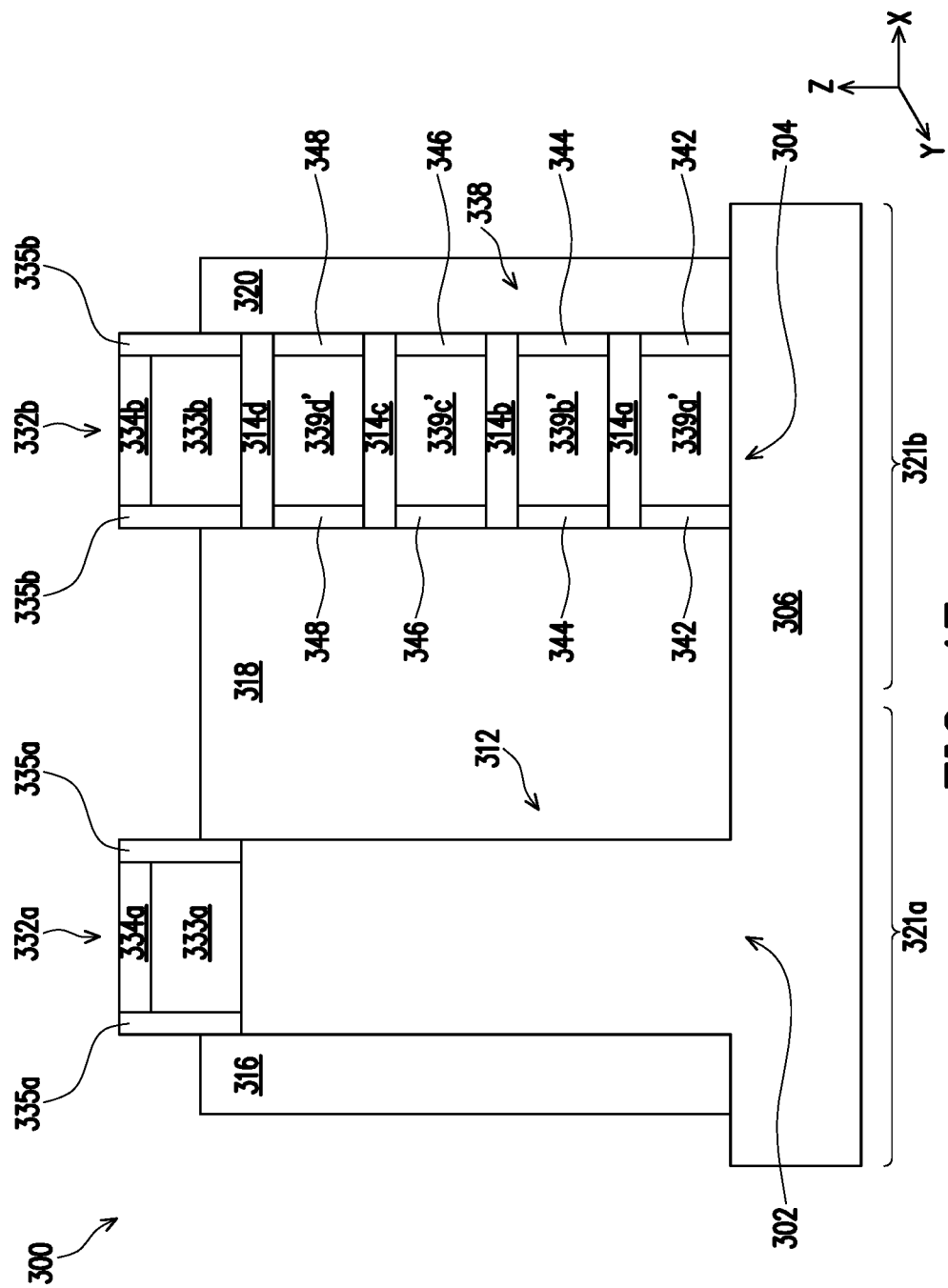

Corresponding to operation 426, FIG. 17 is a cross-sectional view of the memory device 300, cut along line A-A' (FIG. 3), that includes the drain/source regions 316, 318, and 320 (shown in FIG. 3), at one of the various stages of fabrication. The drain/source regions 316-320 may be formed after the blocking mask 340 (shown in FIG. 16) is removed. In some embodiments, the drain/source region 316 may be formed using an epitaxial layer growth process on one exposed end of the fin-based structure 312 (e.g., the left-hand side of the fin-based structure 312). The drain/source region 318 may be formed using the same epitaxial layer growth process on the other exposed end of the fin-based structure 312 (e.g., the right-hand side of the fin-based structure 312), and one exposed end of each of the nanosheets 314a-d (e.g., the left-hand side of the alternating-nanosheet column 338). The drain/source region 320 is formed using the same epitaxial layer growth process on the other exposed end of each of the nanosheets 314a-d (e.g., the right-hand side of the alternating-nanosheet column 338). In some embodiments, a bottom boundary of the drain/source region 318 may be completely in contact with the semiconductor structure 306 (e.g., no additional feature formed between the drain/source region 318 and the semiconductor structure 306).

According to some embodiments, the drain/source region 316 and drain/source region 318 are electrically coupled to the fin-based structure 312; and the drain/source region 318 and drain/source region 320 are electrically coupled to the nano sheets 314a-d. The fin-based structure 312 may function as the conduction channel of the programming transistor 302; and the nanosheets 314a-d may collectively function as the conduction channel of the reading transistor 304. Further, the programming transistor 302 may be electrically coupled the reading transistor 304 in series via the drain/source region 318.

In-situ doping (ISD) may be applied to form doped drain/source regions 316-320, thereby creating the necessary junctions for the programming transistor 302 and reading transistor 304. N-type and p-type FETs are formed by implanting different types of dopants to selected regions (e.g., the drain/source regions 316-320) of the device to form the necessary junction(s). N-type devices can be formed by implanting arsenic (As) or phosphorous (P), and p-type devices can be formed by implanting boron (B).

Figure 18:
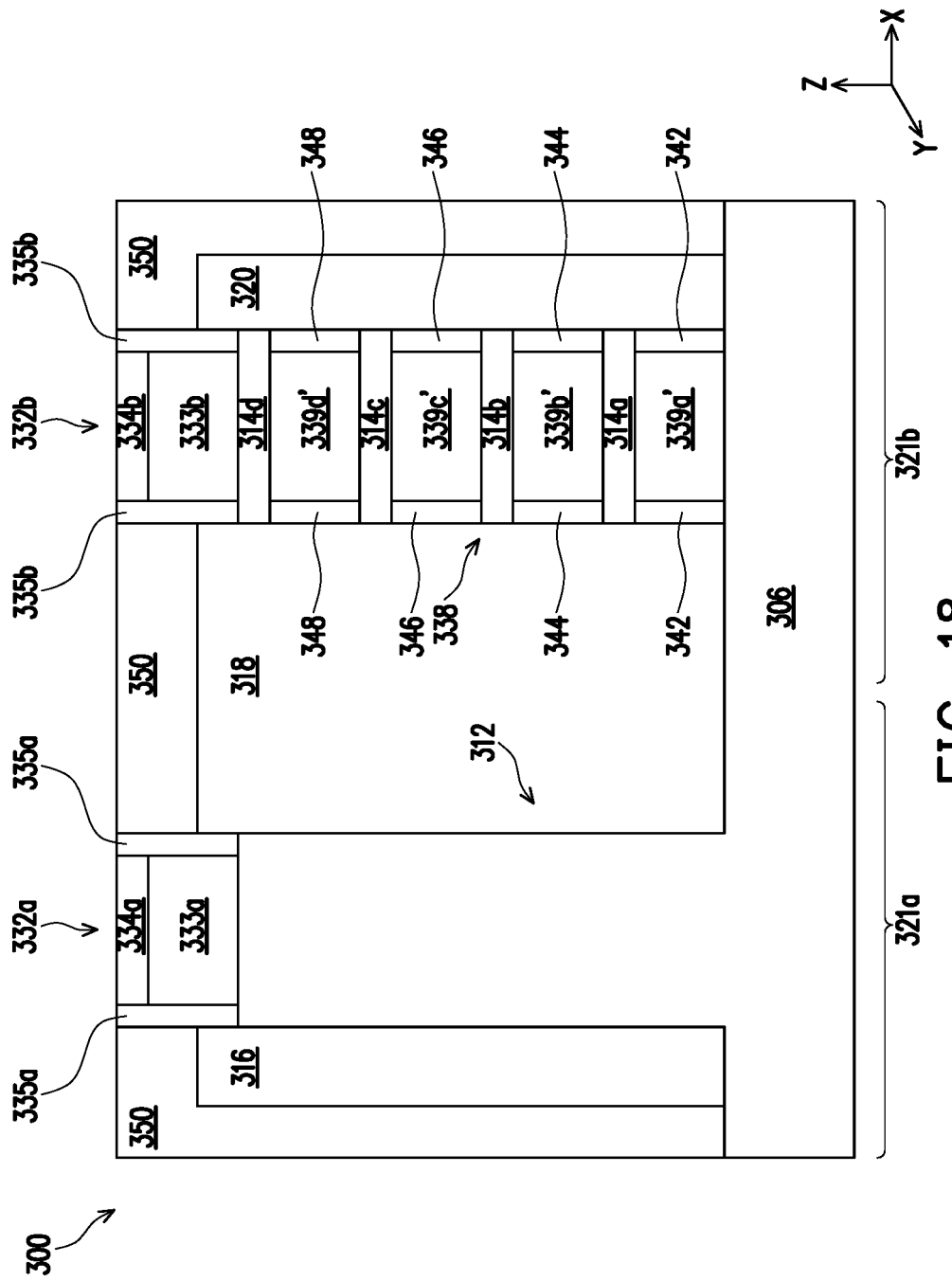

Corresponding to operation 428, FIG. 18 is a cross-sectional view of the memory device 300, cut along line A-A' (FIG. 3), that includes an inter-layer dielectric (ILD) material 350, at one of the various stages of fabrication. The ILD material 350 can be formed by depositing an oxide material in bulk (e.g., silicon dioxide) and polishing the bulk oxide back (e.g., using CMP) to the level of the offset gate spacers 335a-b and the hard masks 334a-b.

Figure 19:
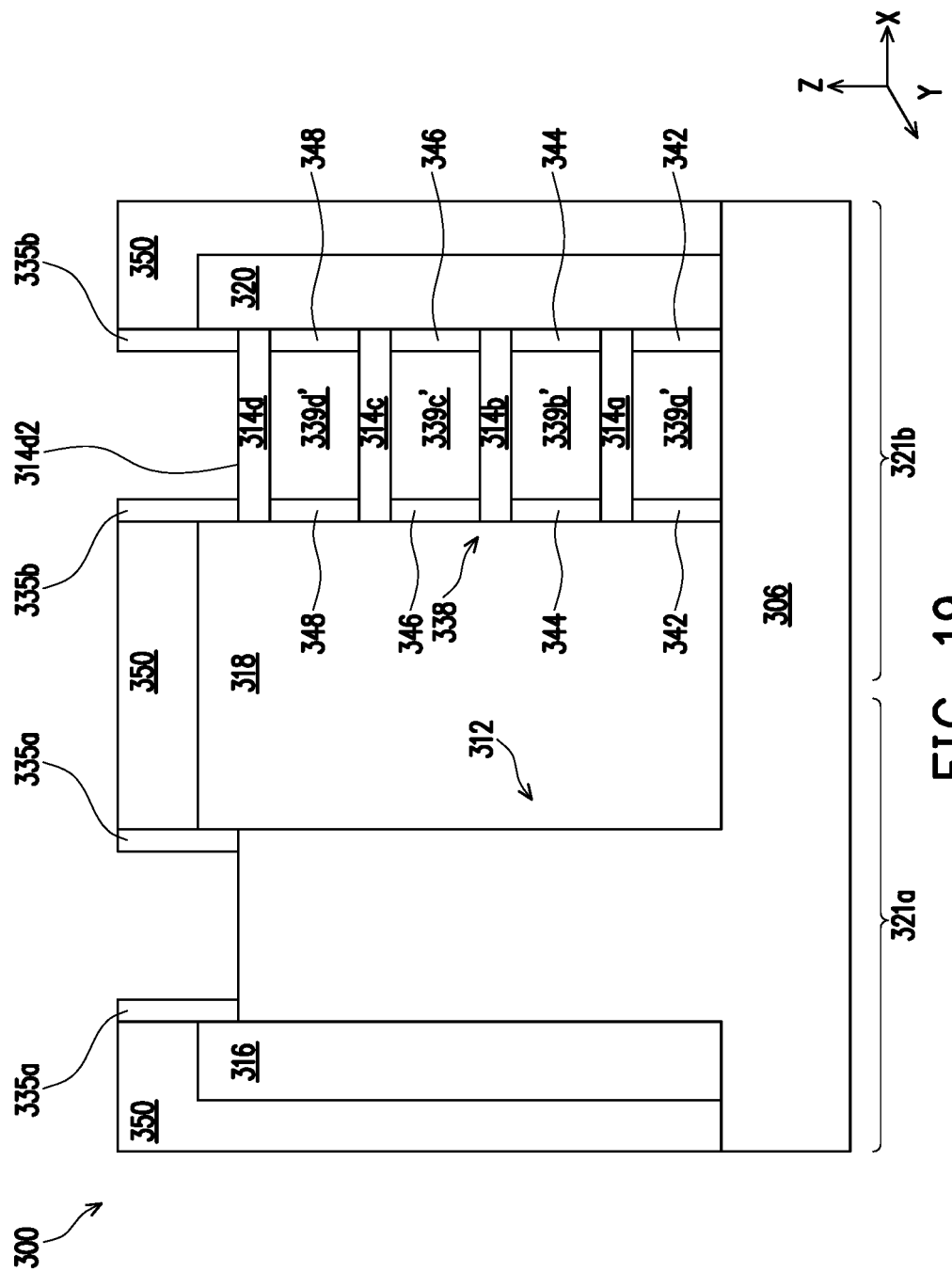

Corresponding to operation 430, FIG. 19 is a cross-sectional view of the memory device 300, cut along line A-A' (FIG. 3), in which the dummy gate stacks 332a-b (FIG. 18) are removed, at one of the various stages of fabrication. Subsequently to forming the protective ILD material 350, the dummy gate stacks 332a (including the dummy gate 333a and hard mask 334a) and 332b (including the dummy gate 333b and hard mask 334b), shown in FIG. 18, are removed. The dummy gate stacks 332a-b can be removed by a known etching process, e.g., RIE or chemical oxide removal (COR).

After the removal of the dummy gate stacks 332a, a top boundary of the fin-based structure 312 may be exposed. Although not shown in the cross-sectional view of FIG. 19, it is appreciated that in addition to the top boundary, the respective 312a sidewalls of the fin-based structure 312 may also be exposed. Similarly, after the removal of the dummy gate stack 332b, a top boundary of the alternating-nanosheet column 338 may be exposed. Specifically, a top boundary 314d2 of the nanosheet 314d may be exposed. Although not shown in the cross-sectional view of FIG. 19, it is appreciated that in addition to the top boundary, sidewalls of the alternating-nanosheet column 338 (e.g., respective sidewalls of the nanosheets 314a-d) may also be exposed.

Figure 20:
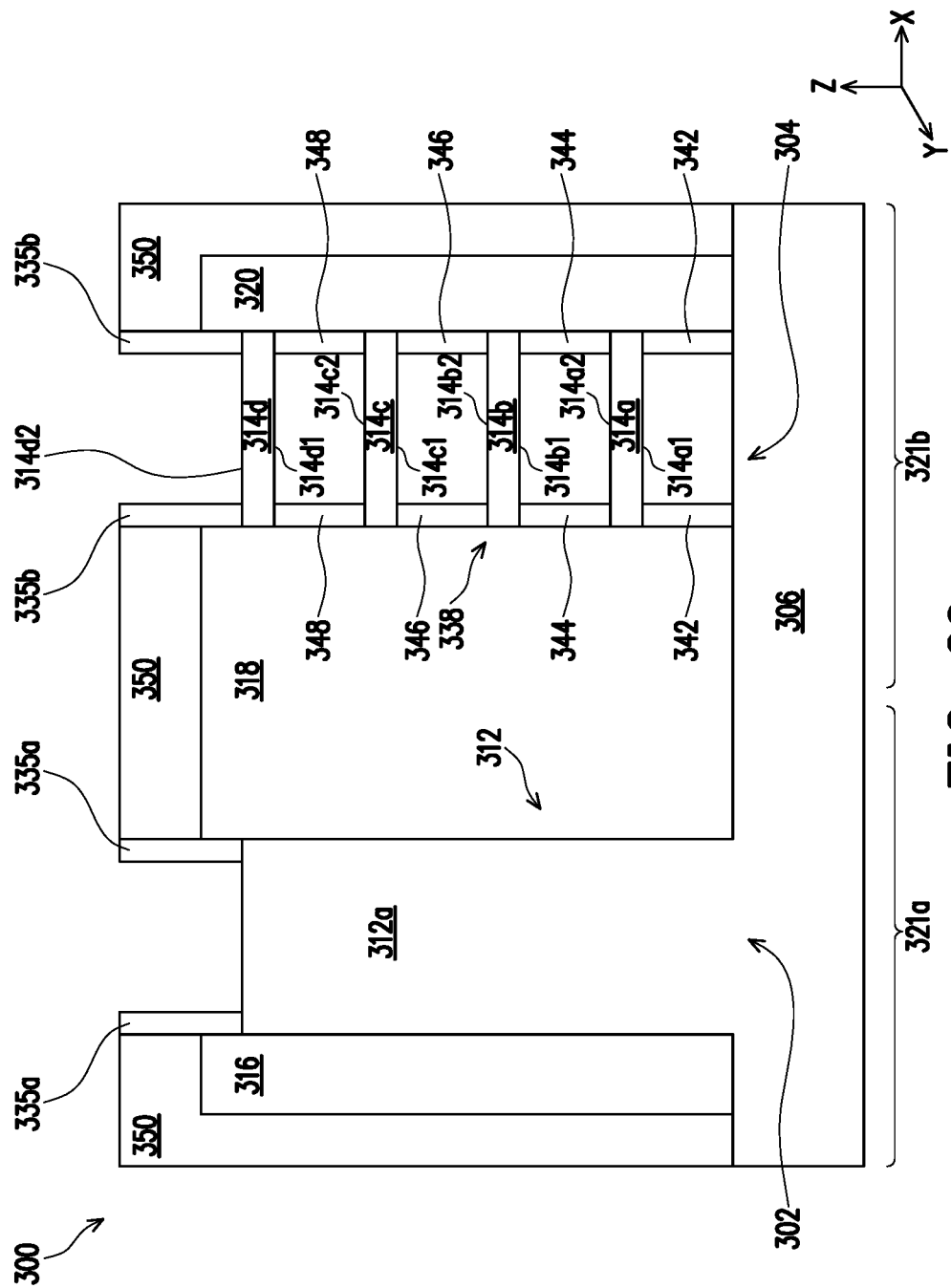

Corresponding to operation 432, FIG. 20 is a cross-sectional view of the memory device 300, cut along line A-A' (FIG. 3), in which the sacrificial nanosheets 339a'-d' of the alternating-nanosheet column 338 (shown in FIG. 19) are removed, at one of the various stages of fabrication. The sacrificial nanosheets 339a'-d' can be removed by applying a selective etch (e.g., a hydrochloric acid (HCl)). After the removal of the sacrificial nanosheets 339a'-d', respective bottom boundaries of the nano sheets 314a-d (314a1, 314b1, 314c1, and 314d1) and respective top boundaries of the nanosheets 314a-c (314a2, 314b2, and 314c2) may be exposed.

As mentioned above, the fin-based structure 312 can function as the conduction channel of the programming transistor 302 to conduct current flowing therethrough, and the nanosheets 314a-d can collectively function as the conduction channel of the reading transistor 304 to conduct current flowing therethrough. Further, the active plane of the conduction channel of the programming transistor 302 may include the sidewall 312a, and the active plane of the conduction channel of the reading transistor 304 may include respective top boundaries of the nanosheets 314a-d, 314a2, 314b2, 314c2, and 314d2, and respective bottom boundaries of the nanosheets 314a-d, 314a1, 314b1, 314c1, and 314d1. By using the fabrication method disclosed herein, the programming transistor 302 can be characterized with an active plane having the {110} crystal plane, and the reading transistor 304 can be characterized with an active plane having the {100} crystal plane. As such, the decent programming performance of the programming transistor 302 and improved reliability of the reading transistor 304 can be concurrently reached.

Figure 21:
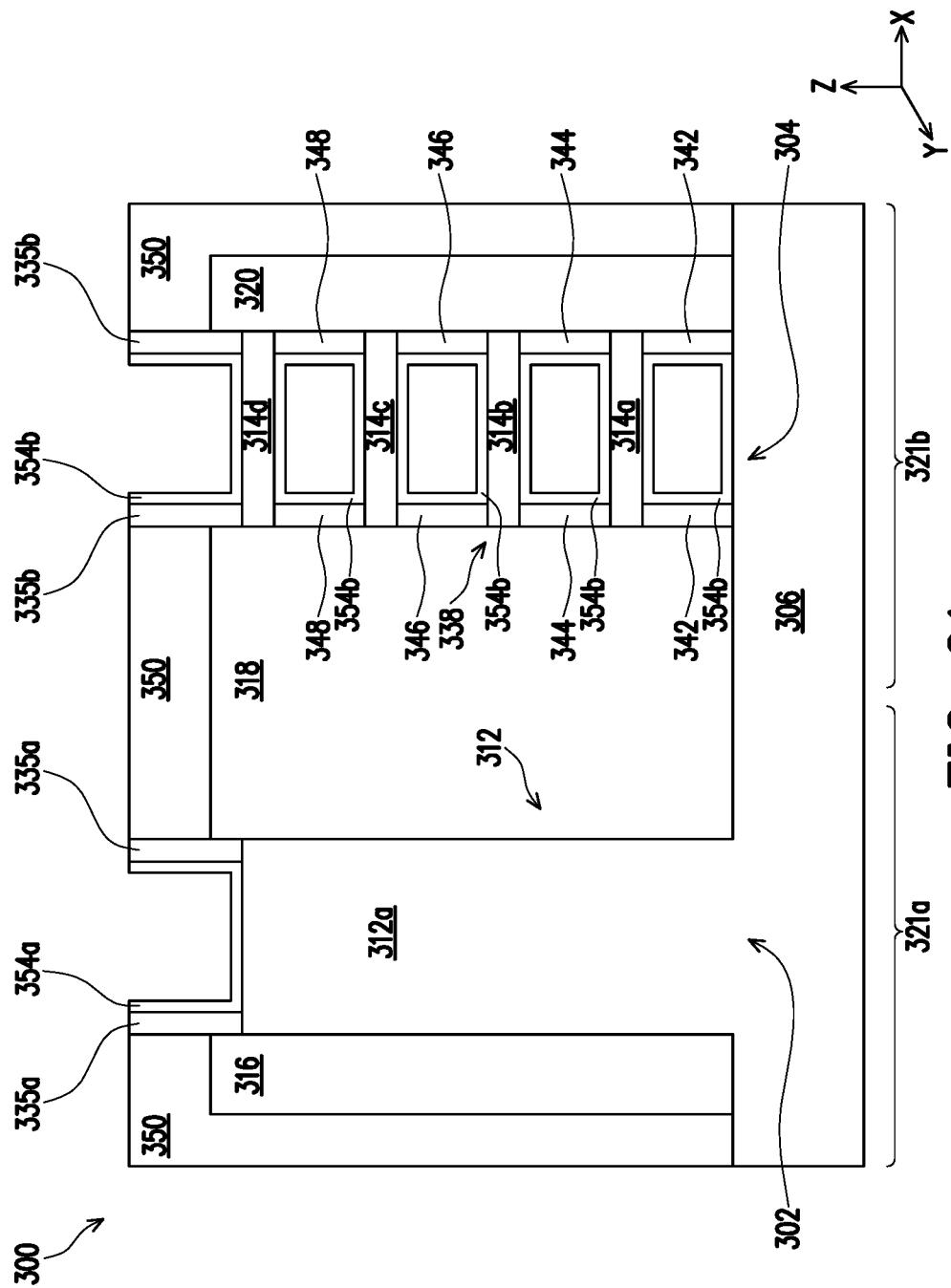

Corresponding to operation 434, FIG. 21 is a cross-sectional view of the memory device 300, cut along line A-A' (FIG. 3), that includes gate dielectrics 354a and 354b, at one of the various stages of fabrication. As shown, the gate dielectric 354a is in direct contact with the fin-based structure 312; and the gate dielectric 354b wraps around each of the nanosheets 314a-d. Although not shown in the cross-sectional view of FIG. 21, it is understand that the gate dielectric 354a is formed to straddle the top boundary and sidewalls 312a of the fin-based structure 312, and the gate dielectric 354b is formed to wrap around each of the nanosheets 314a-d (e.g., the top/bottom boundaries and sidewalls perpendicular to the Y direction). The gate dielectrics 354a and 354b may be formed of different high-k dielectric materials or an identical high-k dielectric material. The gate dielectrics 354a and 354b may include a stack of multiple high-k dielectric materials. The gate dielectrics 354a and 354b can be concurrently or respectively deposited using any suitable method, including, for example, atomic layer deposition (ALD). In some embodiments, the gate dielectrics 354a and 354b may optionally include a substantially thin oxide (e.g., $SiO_x$) layer.

Figure 22:
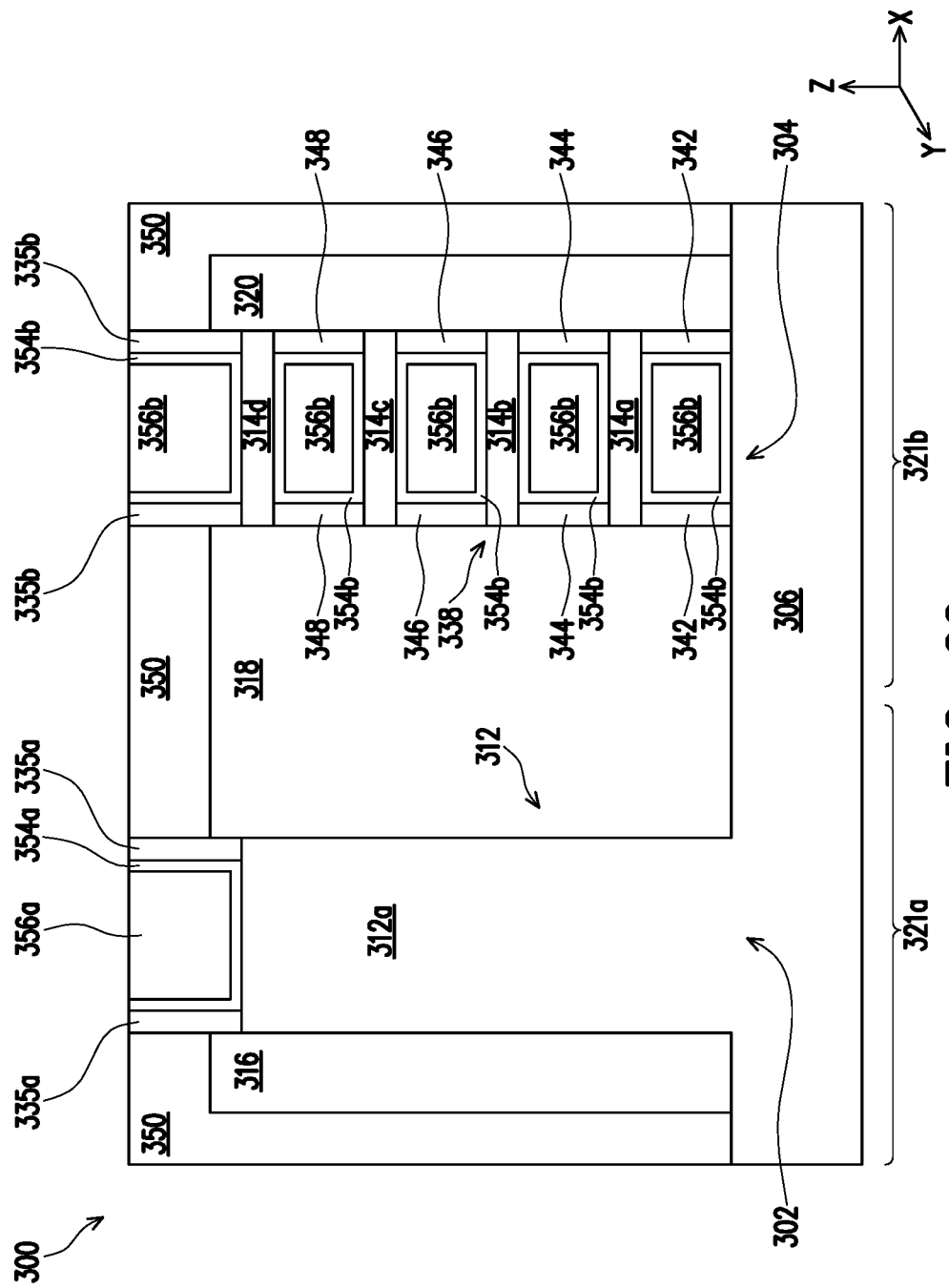

Corresponding to operation 436, FIG. 22 is a cross-sectional view of the memory device 300, cut along line A-A' (FIG. 3), that includes gate metals 356a and 356b, at one of the various stages of fabrication. In some embodiments, the gate metal 356a can straddle the top boundary and sidewalls 312a of the fin-based structure 312 with the gate dielectric 354a disposed therebetween. The gate metal 356b can wrap around each of the nanosheets 314a-d with the gate dielectric 354b disposed therebetween. In some embodiments, the gate structure 308 (FIG. 3) includes the gate metal 356a, the corresponding gate dielectric 354a, and the offset gate spacers 335a; and the gate structure 310 (FIG. 3) includes the gate metal 356b, the corresponding gate dielectric 354b, and the offset gate spacers 335b. The gate metals 356a-b may be formed of different metal materials or an identical metal material. The gate metals 356a-b may each include a stack of multiple metal materials. It is understood that the gate metals 356a-b may each include any of other types of conductor materials, while remaining within the scope of the present disclosure. The gate metals 356a-b can be deposited using any suitable method, including, for example, CVD.

Although the gate metals 356a-b are each shown as a two-dimensional structure in FIG. 22, it is appreciated that the gate metals 356a-b are each formed as a three-dimensional structure. Specifically, the gate metals 356a-b can each include a number of gate metal sections spaced apart from each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding nanosheet, with a gate dielectric disposed therebetween.

For example in FIG. 22, the gate metal 356b can include a number of gate metal sections. Two adjacent ones of the gate metal sections may adjoin together to wrap around the one of the nanosheets 314a-d, with a portion of the gate dielectric 354b disposed therebetween. In some embodiments, such a gate metal section, together with the corresponding portion of the gate dielectric, that at least partially wrap around one of the Si nanosheets may be collectively referred to as a gate stack. The gate stack is operatively associated with the wrapped Si nanosheet (e.g., modulating the current conducting in the nanosheet). The gate stack may sometimes be referred to as an all-around gate stack.

Figure 23:
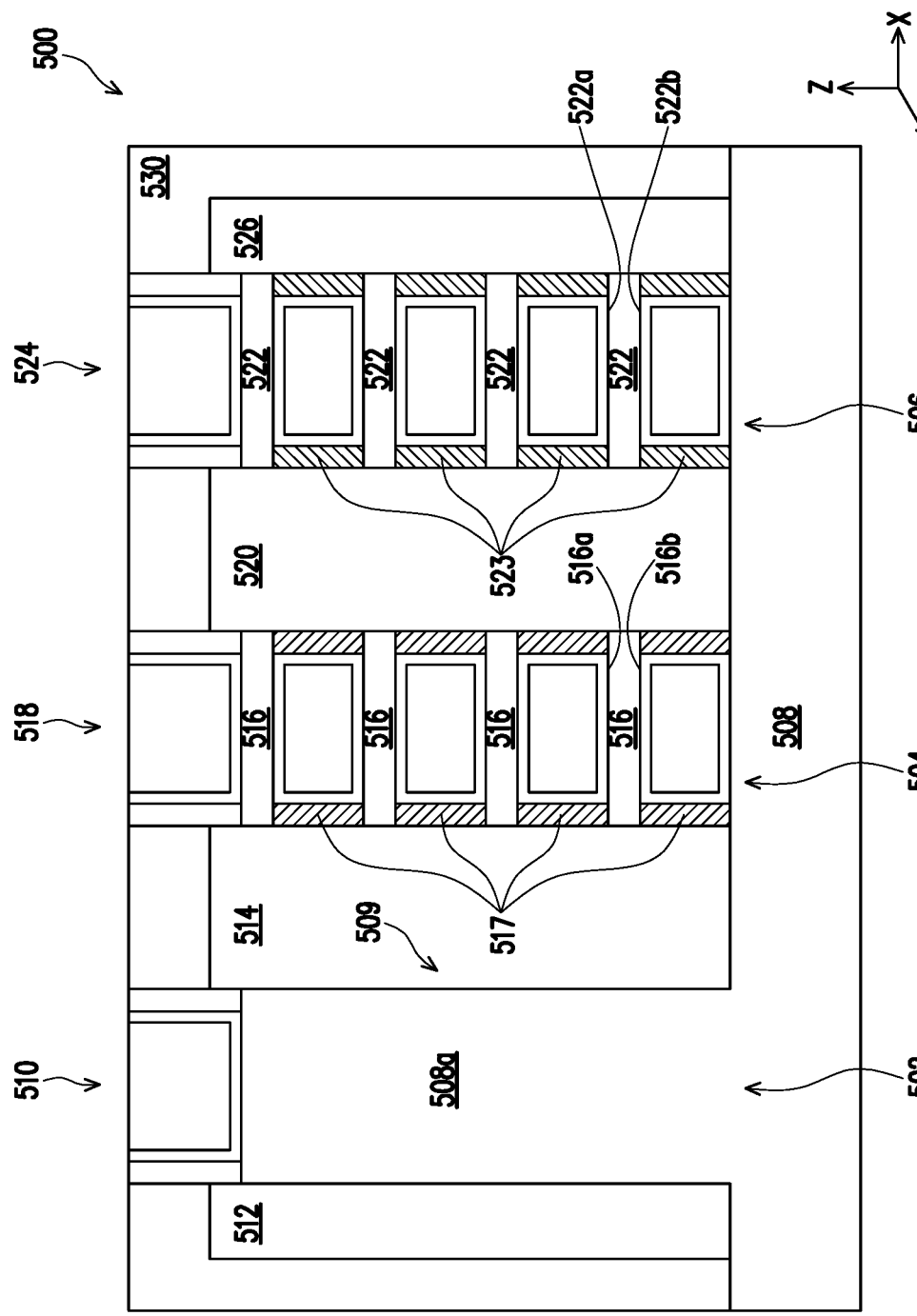
FIG. 23 illustrates a cross-sectional view of another memory device, in accordance with some embodiments.

FIG. 23 illustrates a cross-sectional view of another example memory device 500. In accordance with some embodiments, the memory device 500 may be a portion of an anti-fuse memory cell that includes a programming transistor and multiple reading transistors, e.g., the memory cell 200. The memory device 500 is substantially similar to the memory device 300 except that the memory device 500 includes an additional reading transistor. Thus, the following discussions shall be focused on the difference between the memory devices 300 and 500.

As shown, the memory device 500 includes a programming transistor 502, a first reading transistor 504, and a second reading transistor 506 formed on a substrate 508. The programming transistor 502 is formed as a fin-based transistor, and the reading transistors 504 and 506 are each formed as a nanosheet transistor. For example, the programming transistor 502 includes: a fin-based structure 509 extending from the substrate 508, a gate structure 510 straddling the fin-based structure 509, drain/source regions 512 and 514 formed on respective sides of the fin-based structure 509; the reading transistor 504 includes: a number of nanosheets 516 vertically spaced apart from one another, a gate structure 518 wrapping around each of the nanosheets 516, drain/source regions 514 and 520 formed on respective sides of the nanosheets 516; and the reading transistor 506 includes: a number of nanosheets 522 vertically spaced apart from one another, a gate structure 524 wrapping around each of the nanosheets 522, drain/source regions 520 and 526 formed on respective sides of the nano sheets 522. The reading transistor 504 may further include a number of inner spacers 517 disposed between a portion of the gate structure 518 and the drain/source region 514, and between the portion of the gate structure 518 and the drain/source region 520. The reading transistor 506 may further include a number of inner spacers 523 disposed between a portion of the gate structure 524 and the drain/source region 520, and between the portion of the gate structure 524 and the drain/source region 526. The transistors 502-506 may be at least partially embedded in an ILD material 530.

In some embodiments, the fin-based structure 509 of the programming transistor 502 may have a first crystal lattice direction, and the respective nanosheets, 516 and 522, of the reading transistors, 504 and 506, may have a second, different crystal lattice direction. For example, the fin-based structure 509 has a {110} crystal lattice direction, and the nanosheets, 516 and 522, have a {100} crystal lattice direction. Specifically, sidewalls 408a of the fin-based structure 509 may be characterized with a {110} crystal plane, top boundary and bottom boundary (e.g., 516a, 516b) of each of the nano sheets 516 may be characterized with a {100} crystal plane, and top boundary and bottom boundary (e.g., 522a, 522b) of each of the nano sheets 522 may be characterized with the same {100} crystal plane.

In one aspect of the present disclosure, a semiconductor device is disclosed. The semiconductor device includes a fin-based structure formed on a substrate. The semiconductor device includes a plurality of first nanosheets, vertically spaced apart from one another, that are formed on the substrate. The semiconductor device includes a first source/drain (S/D) region electrically coupled to a first end of the fin-based structure. The semiconductor device includes a second S/D region electrically coupled to both of a second end of the fin-based structure and a first end of the plurality of first nanosheets. The semiconductor device includes a third S/D region electrically coupled to a second end of the plurality of first nano sheets. The fin-based structure has a first crystal lattice direction and the plurality of first nano sheets have a second crystal lattice direction, which is different from the first crystal lattice direction.

In another aspect of the present disclosure, a semiconductor device is disclosed. The semiconductor device includes. The semiconductor device includes a fin-based structure formed on a substrate. The fin-based structure is extended along a first direction. The semiconductor device includes one or more first nanosheets disposed on the substrate. Each of the one or more first nanosheets is spaced apart from one another along a second direction perpendicular to the first direction. The semiconductor device includes a first source/drain (S/D) region disposed between the fin-based structure and the one or more first nanosheets along the first direction. Sidewalls of the fin-based structure each has a first crystal plane direction along a third direction perpendicular to the first direction and the second direction, and a top boundary and a bottom boundary of each of the first nanosheets have a second, different crystal plane direction.

In yet another aspect of the present disclosure, a method for fabricating a semiconductor device is disclosed. The method includes forming a fin-based structure extending from a top boundary of a substrate, wherein the fin-based structure is made of a first semiconductor material. The method include forming a nanosheet-based structure protruding from the top boundary of the substrate. The nanosheet-based structure includes one or more first nanosheets, made of a second semiconductor material, and one or more second nanosheets, made of the first semiconductor material, the one or more first nanosheets and the one or more second nanosheets being alternatingly disposed with respect to each other. The method includes epitaxially growing a first source/drain (S/D) region, a second S/D region, and a third S/D region. The first S/D region is disposed between the fin-based structure and the nanosheet-based structure, the second S/D region is disposed opposite the fin-based structure from the first S/D region, and the third S/D region is disposed opposite the nanosheet-based structure from the first S/D region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin-based structure formed on a substrate, wherein the fin-based structure extends along a physical direction;
   a plurality of first nanosheets, vertically spaced apart from one another, that are formed on the substrate, wherein the plurality of first nanosheets extend along the physical direction;
   a first source/drain (S/D) region coupled to a first end of the fin-based structure along the physical direction, and having a first conductive type;
   a second S/D region coupled to both of a second end of the fin-based structure and a first end of the plurality of first nanosheets along the physical direction, and having the first conductive type; and
   a third S/D region coupled to a second end of the plurality of first nanosheets along the physical direction, and having the first conductive type;
   wherein at least one active plane of the fin-based structure has a first crystal lattice direction, and at least one active plane of each the plurality of first nanosheets has a second crystal lattice direction that is different from the first crystal lattice direction.

2. The semiconductor device of claim 1, wherein the first crystal lattice direction includes a <110> crystal lattice direction, and the second crystal lattice direction includes a [100] crystal lattice direction.

3. The semiconductor device of claim 1, wherein the first crystal lattice direction includes at least one of the following crystal lattice directions: [110], [101], [011], [$\bar{1}$10], [1$\bar{1}$0], [$\bar{1}$01], [10$\bar{1}$], [01$\bar{1}$], or [0$\bar{1}$1], and the second crystal lattice direction includes at least one of the following crystal lattice directions: [100], [010], [001], [$\bar{1}$00], [0$\bar{1}$0], or [00$\bar{1}$].

4. The semiconductor device of claim 1, wherein sidewalls of the fin-based structure each has a {110} crystal plane, and a top boundary and bottom boundary of each of the plurality of first nanosheets each have a {100} crystal plane.

5. The semiconductor device of claim 1, wherein the fin-based structure, the first S/D region, and the second S/D region are configured as at least a portion of a programming transistor of an anti-fuse memory cell, and the plurality of first nanosheets, the second S/D region, and the third S/D region are configured as at least a portion of a reading transistor of the anti-fuse memory cell.

6. The semiconductor device of claim 5, wherein the reading transistor is electrically coupled to the programming transistor in series via the second shared S/D region.

7. The semiconductor device of claim 1, further comprising:
   a plurality of second nanosheets, vertically spaced apart from one another, that are formed on the substrate, the third S/D region coupled to a first end of the plurality of second nanosheets along the physical direction;
   a fourth S/D region electrically coupled to a second end of the plurality of second nanosheets along the physical direction,
   wherein at least one active plane of each of the plurality of second nanosheets has the second crystal lattice direction.

8. The semiconductor device of claim 7, wherein sidewalls of the fin-based structure each has a {110} crystal plane, and a top boundary and bottom boundary of each of the plurality of first and second nanosheets each have a {100} crystal plane.

9. The semiconductor device of claim 7, wherein the fin-based structure, the first S/D region, and the second S/D region are configured as at least a portion of a programming transistor of an anti-fuse memory cell, the plurality of first nanosheets, the second S/D region, and the third S/D region are configured as at least a portion of a first reading transistor of the anti-fuse memory cell, and the plurality of second nanosheets, the third S/D region, and the fourth S/D region are configured as at least a portion of a second reading transistor of the anti-fuse memory cell.

10. The semiconductor device of claim 1, further comprising:
a plurality of all-around gate stacks operatively associated with the plurality of first nanosheets, each of the plurality of gate stacks including a metal gate and a gate dielectric.

11. A semiconductor device, comprising:
a fin-based structure formed on a substrate, the fin-based structure extended along a first direction;
one or more first nanosheets disposed on the substrate, each of the one or more first nanosheets spaced apart from one another along a second direction perpendicular to the first direction, wherein the one or more first nanosheets are also extended along the first direction;
a first source/drain (S/D) region disposed between the fin-based structure and the one or more first nanosheets along the first direction, and having a first conductive type;
a second S/D region disposed opposite the fin-based structure from the first S/D region, and having the first conductive type; and
a third S/D region disposed opposite the one or more first nanosheets from the first S/D region, and having the first conductive type;
wherein sidewalls of the fin-based structure, facing toward or away from a third direction perpendicular to the first direction and the second direction, each have a first crystal plane direction, and a top boundary and a bottom boundary of each of the first nanosheets each have a second, different crystal plane direction.

12. The semiconductor device of claim 11, wherein the first crystal plane direction includes (110), and the second, different crystal plane direction includes (100).

13. The semiconductor device of claim 11, wherein the fin-based structure, the first S/D region, and the second S/D region are configured as at least a portion of a programming transistor of an anti-fuse memory cell, and the one or more first nanosheets, the first S/D region, and the third S/D region are configured as at least a portion of a reading transistor of the anti-fuse memory cell.

14. The semiconductor device of claim 13, wherein the programming transistor is electrically coupled to the reading transistor via the first S/D region.

15. The semiconductor device of claim 11, further comprising:
one or more second nanosheets disposed on the substrate, each of the one or more second nanosheets spaced apart from one another along the second direction, wherein the third S/D region is disposed between the one or more second nanosheets and the one or more first nanosheets along the first direction; and
a fourth source/drain (S/D) region disposed opposite the one or more second nanosheets from the third S/D region.

16. The semiconductor device of claim 15, wherein the fin-based structure, the first S/D region, and the second S/D region are configured as at least a portion of a programming transistor of an anti-fuse memory cell, the one or more first nanosheets, the first S/D region, and the third S/D region are configured as at least a portion of a first reading transistor of the anti-fuse memory cell, and the one or more second nanosheets, the third S/D region, and the fourth S/D region are configured as at least a portion of a second reading transistor of the anti-fuse memory cell.

17. The semiconductor device of claim 16, wherein the programming transistor is electrically coupled to the first reading transistor via the first S/D region, and the first reading transistor is electrically coupled to the second reading transistor via the third S/D region.

18. A semiconductor device, comprising:
a first transistor having a first conductive type; and
a second transistor having the first conducive type and connected to the first transistor in series;
wherein the first transistor includes a fin-based structure extending along a physical direction, and at least one active plane of the fin-based structure has a first crystal lattice direction;
wherein the second transistor includes a plurality of nanosheets vertically spaced apart from one another and extending along the physical direction, and at least one active plane of each the plurality of first nanosheets has a second crystal lattice direction that is different from the first crystal lattice direction.

19. The semiconductor device of claim 18,
wherein the first transistor includes:
a first source/drain (S/D) region disposed between the fin-based structure and the one or more first nanosheets along the physical direction, and having the first conductive type; and
a second S/D region disposed opposite the fin-based structure from the first S/D region, and having the first conductive type; and
wherein the second transistor includes:
the first S/D region; and
a third S/D region disposed opposite the one or more first nanosheets from the first S/D region, and having the first conductive type.

20. The semiconductor device of claim 18, wherein the first crystal lattice direction includes a <110> crystal lattice direction, and the second crystal lattice direction includes a [100] crystal lattice direction.

* * * * *